(12) United States Patent
Ikeda

(10) Patent No.: US 9,319,015 B2
(45) Date of Patent: Apr. 19, 2016

(54) AUDIO PROCESSING APPARATUS AND METHOD

(71) Applicant: CANON KABUSHIKI KAISHA, Tokyo (JP)

(72) Inventor: Shingo Ikeda, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 150 days.

(21) Appl. No.: 14/139,058

(22) Filed: Dec. 23, 2013

(65) Prior Publication Data

US 2014/0185833 A1 Jul. 3, 2014

(30) Foreign Application Priority Data

Dec. 27, 2012 (JP) ................................. 2012-286160

(51) Int. Cl.
*H03G 3/20* (2006.01)
*H03G 3/30* (2006.01)
*H03G 7/00* (2006.01)

(52) U.S. Cl.
CPC ............... *H03G 3/301* (2013.01); *H03G 7/002* (2013.01); *H03G 7/007* (2013.01)

(58) Field of Classification Search
None
See application file for complete search history.

(56) References Cited

U.S. PATENT DOCUMENTS

| | | | |
|---|---|---|---|
| 5,352,988 A * | 10/1994 | Park ............................. | 330/141 |
| 5,923,768 A * | 7/1999 | Frindle et al. ................. | 381/106 |
| 6,472,938 B2 * | 10/2002 | Imai ............................. | 330/140 |
| 6,535,846 B1 * | 3/2003 | Shashoua ...................... | 704/225 |
| 7,058,188 B1 * | 6/2006 | Allred ........................... | 381/107 |
| 7,248,702 B2 * | 7/2007 | Packard ......................... | 381/61 |
| 7,353,169 B1 * | 4/2008 | Goodwin et al. ............. | 704/224 |
| 8,315,411 B2 * | 11/2012 | Hanna et al. .................. | 381/107 |
| 2006/0034400 A1 * | 2/2006 | Yang et al. .................... | 375/345 |
| 2006/0210096 A1 * | 9/2006 | Stokes et al. .................. | 381/107 |
| 2008/0082189 A1 * | 4/2008 | Kuwaoka ....................... | 700/94 |
| 2008/0212799 A1 * | 9/2008 | Breitschadel ................. | 381/106 |
| 2009/0161889 A1 * | 6/2009 | Magrath ........................ | 381/107 |
| 2009/0271185 A1 * | 10/2009 | Smithers et al. ............. | 704/225 |
| 2010/0195846 A1 * | 8/2010 | Yokoyama .................... | 381/102 |
| 2012/0177220 A1 * | 7/2012 | Nakamura .................... | 381/94.1 |
| 2012/0263329 A1 * | 10/2012 | Kjeldsen et al. ............. | 381/315 |
| 2012/0321104 A1 | 12/2012 | Kemmerer et al. | |

FOREIGN PATENT DOCUMENTS

| | | |
|---|---|---|
| CN | 101807894 A | 8/2010 |
| CN | 202334444 U | 7/2012 |
| CN | 102740212 A | 10/2012 |
| JP | 2008-129107 A | 6/2008 |

OTHER PUBLICATIONS

Jan. 27, 2016 Chinese Office Action, which is enclosed with an English Translation, that issued in Chinese Patent Application No. 201310741393.7.

* cited by examiner

*Primary Examiner* — Brenda Bernardi
(74) *Attorney, Agent, or Firm* — Cowan, Liebowitz & Latman, P.C.

(57) ABSTRACT

There is provided an audio processing apparatus. An obtaining unit obtains an audio signal. A first audio level controller gives a first gain to the audio signal obtained by the obtaining unit. A second audio level controller gives a second gain to the audio signal output from the first audio level controller. A time constant in processing for increasing the first gain of the first audio level controller is larger than a time constant in processing for increasing the second gain of the second audio level controller.

20 Claims, 18 Drawing Sheets

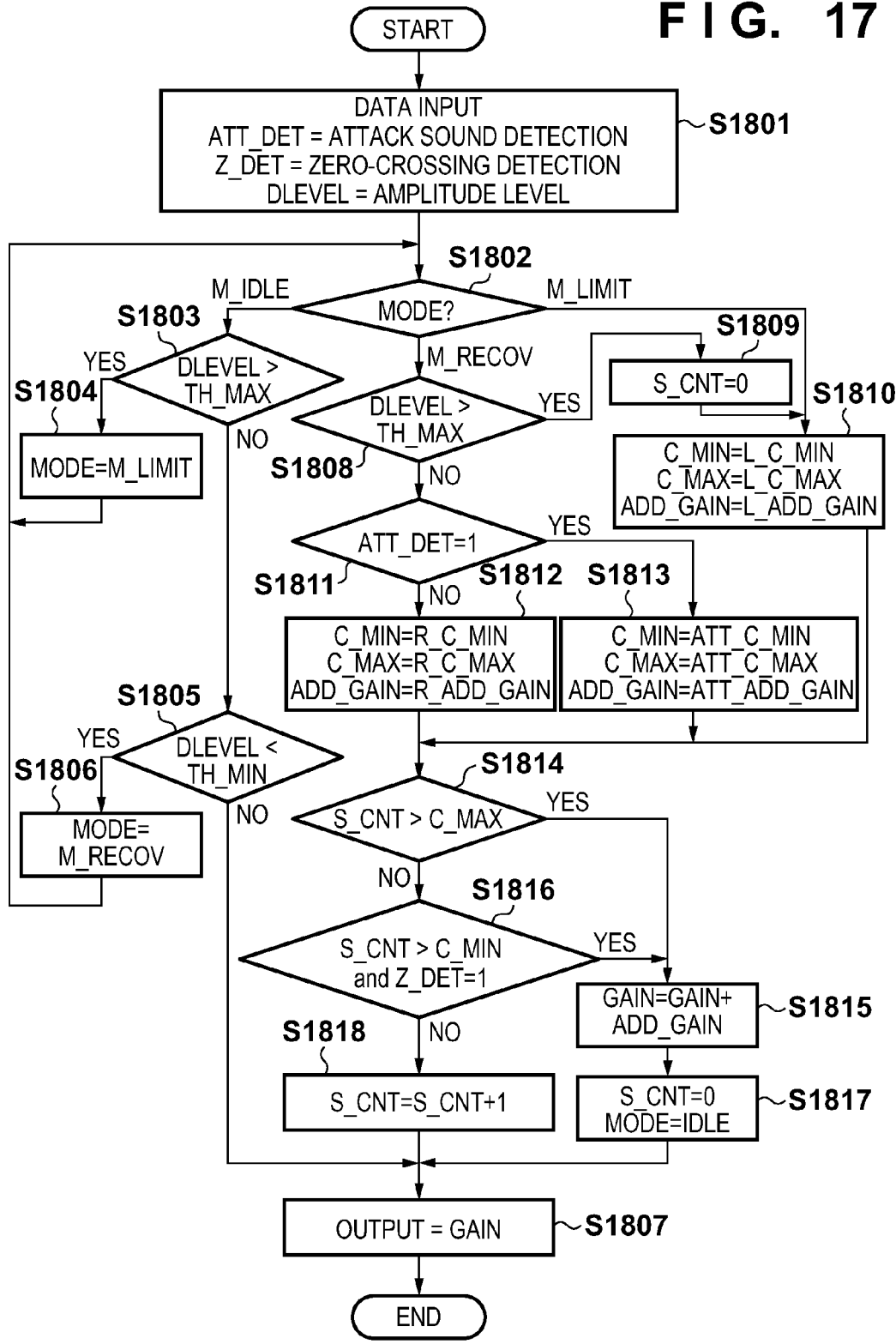

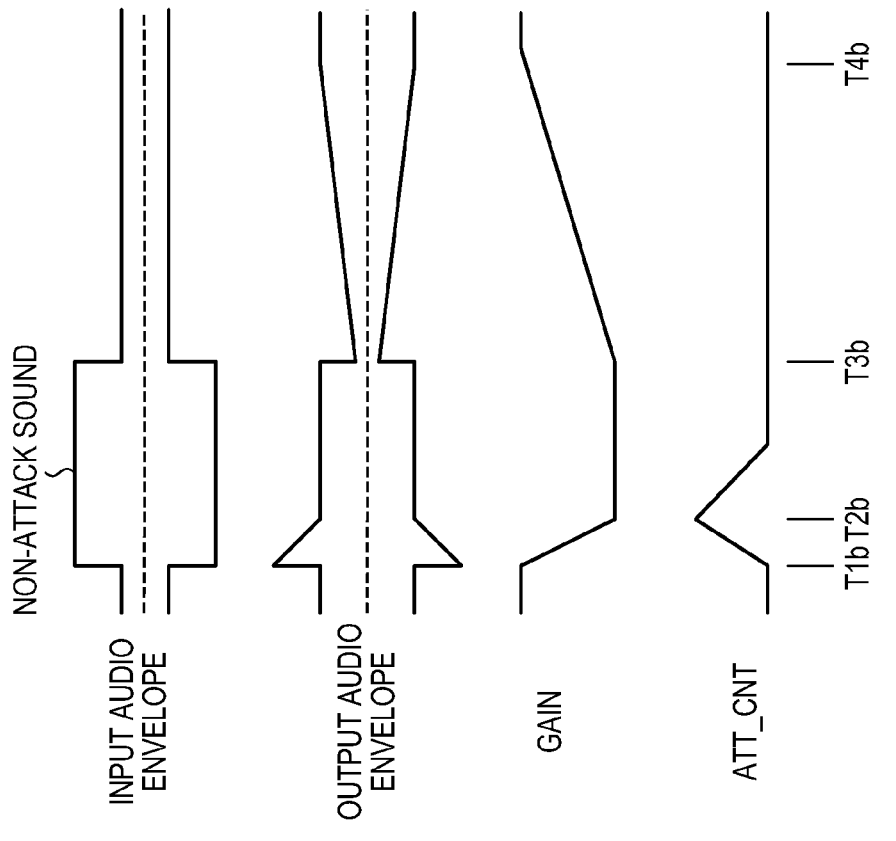
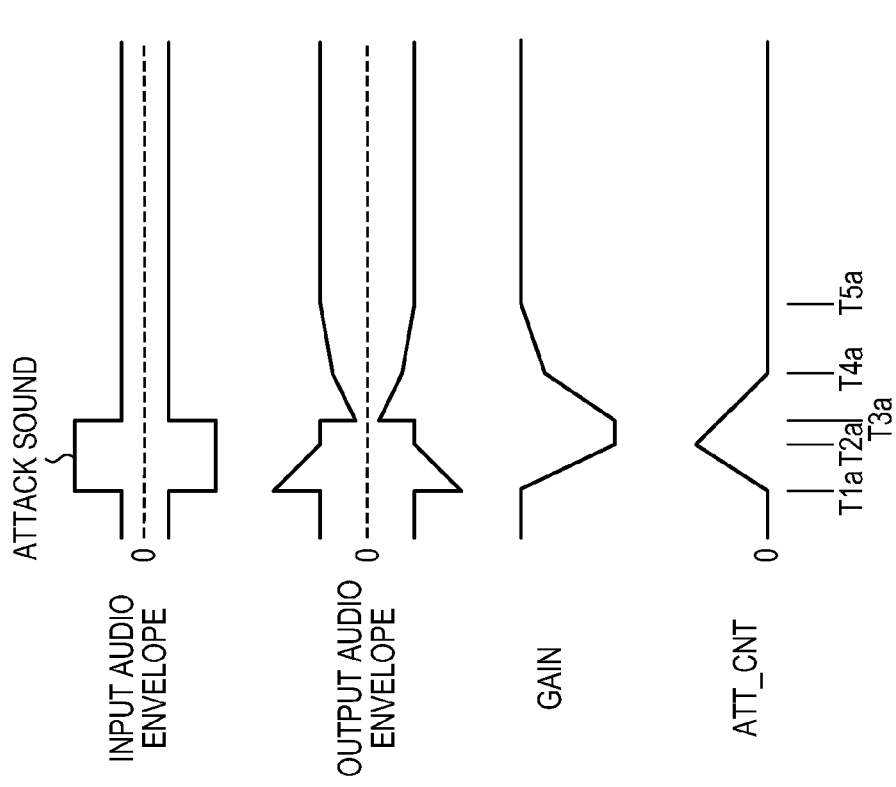

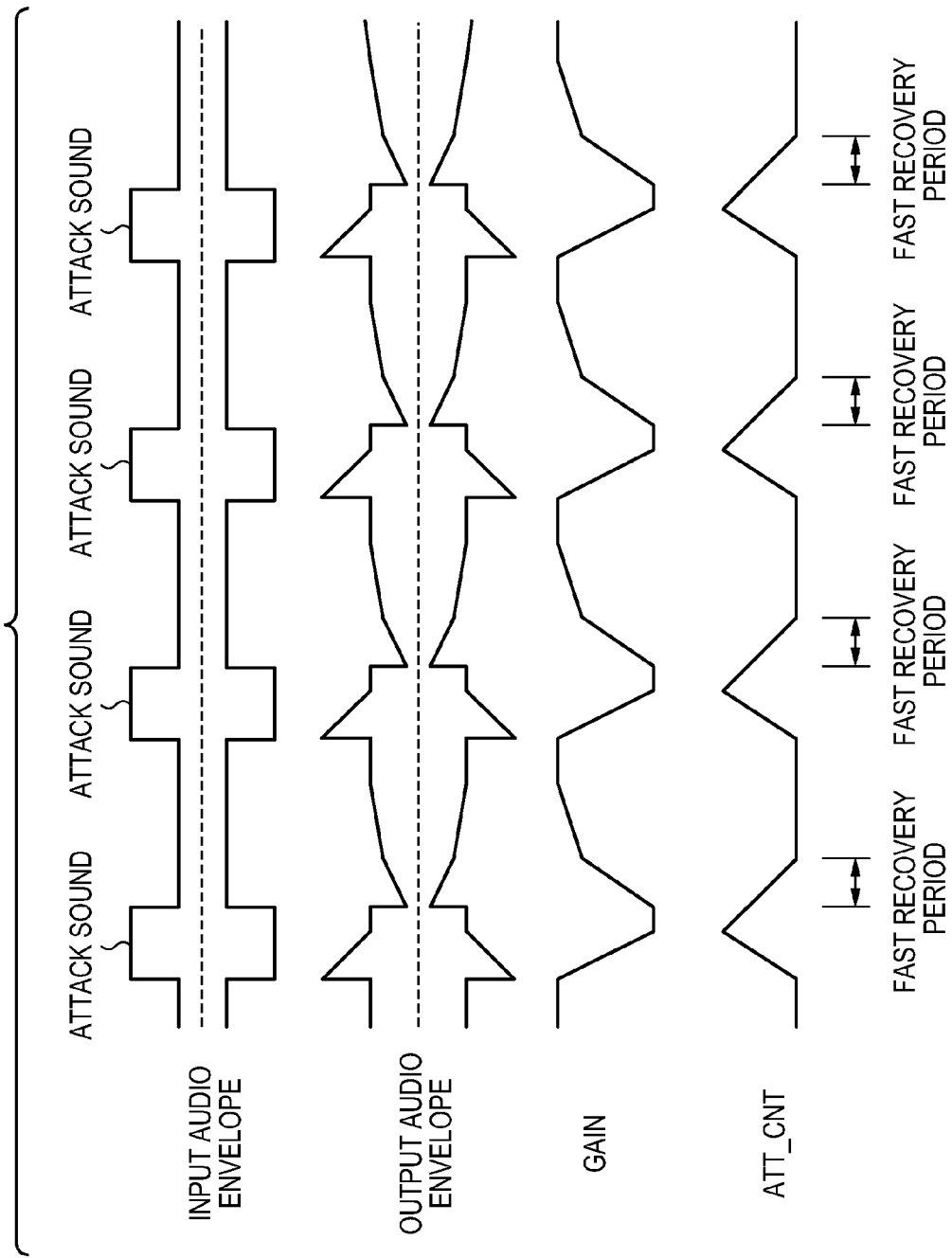

AUDIO PROCESSING APPARATUS AND METHOD

BACKGROUND OF THE INVENTION

1. Field of the Invention

The present invention relates to an audio processing apparatus and method.

2. Description of the Related Art

Conventionally, an audio processing apparatus, which has an ALC (Automatic Level Control) function for controlling a level of an input audio to an appropriate level, is known (see Japanese Patent Laid-Open No. 2008-129107). The ALC roughly executes control to suppress a level when an input sound is too large (limit operation) or to amplify a level when it is too small (recovery operation). In this case, a measure against a case in which a sudden sound, that is, a sound which rises abruptly and falls abruptly soon after is input becomes problematic. Such sound is generally called "attack sound". More specifically, when a leading edge of the attack sound is input, a level is suppressed by the limit operation. After that, when a falling edge of the attack sound is input, the level is increased by the recovery operation. However, since the attack sound falls abruptly, the recovery operation reacts slowly, and an audio level immediately after the falling edge becomes too small to be harder to hear.

Hence, in the recovery operation upon detection of an attack sound, a level gain is set to be higher than usual, thus quickening a recovery reaction.

However, when attack sounds are successively input at short intervals, if the level gain is set to be higher than usual in the recovery operation of one attack sound, an audio is unwantedly clipped and distorted at a leading edge of each subsequent attack sound.

SUMMARY OF THE INVENTION

The present invention has been made to solve the aforementioned problems. That is, the present invention can attain satisfactory automatic level control which does not cause any distortion even when attack sounds are successively input at short intervals.

According to one aspect of the present invention, an audio processing apparatus comprises an obtaining unit configured to obtain an audio signal, a first audio level controller configured to give a first gain to the audio signal obtained by the obtaining unit, and a second audio level controller configured to give a second gain to the audio signal output from the first audio level controller, wherein a time constant in processing for increasing the first gain of the first audio level controller is larger than a time constant in processing for increasing the second gain of the second audio level controller.

Further features of the present invention will become apparent from the following description of exemplary embodiments (with reference to the attached drawings).

BRIEF DESCRIPTION OF THE DRAWINGS

FIG. 17 is a flowchart showing the operation of an amplitude gain decision unit;

FIG. 18A shows charts of an ALC operation when an input sound is an attack sound, and FIG. 18B shows charts of an ALC operation when an input sound is not an attack sound; and FIG. 19 shows charts of an ALC operation when a plurality of attack sounds are successively input.

DESCRIPTION OF THE EMBODIMENTS

Various exemplary embodiments, features, and aspects of the invention will be described in detail below with reference to the drawings. Note that the arrangements to be described in the following embodiments are presented only for the exemplary purpose, and the present invention is not limited to the illustrated arrangements.

The following embodiments will explain an audio processing apparatus, but the present invention is applicable to any other apparatuses which can process an audio. The audio processing apparatus can be, for example, an image capturing apparatus, mobile phone, smartphone, personal computer, IC recorder, car navigation system, vehicle including a speech recognition function, and the like. These audio processing apparatuses include, for example, a block for controlling audio signals collected by an audio collection unit such as a microphone.

<Explanation of Recovery Operation Upon Detection of Attack Sound>

The present invention relates to an audio processing apparatus having an ALC (Automatic Level Control) function for adjusting an amplitude level of an input audio signal to fall within a predetermined range. Prior to a detailed description of embodiments of the present invention, a recovery operation upon detection of an attack sound in the ALC of the audio processing apparatus will be described.

Figure 14:
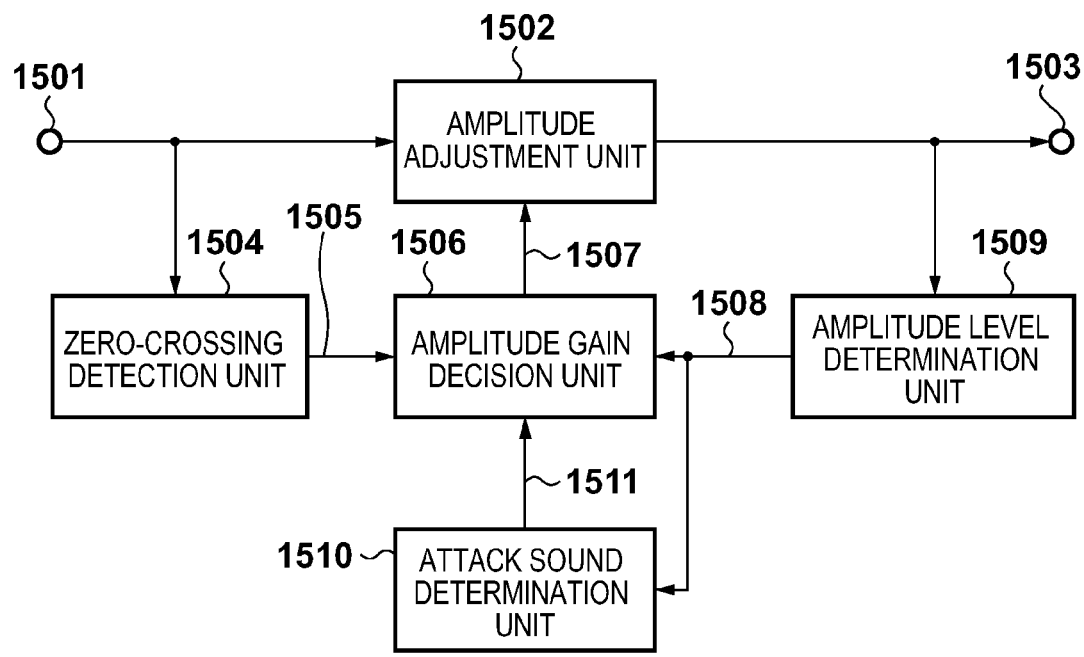
FIG. 14 is a block diagram showing an arrangement example of an ALC unit of an audio processing apparatus.

FIG. 14 shows an example of the arrangement of an ALC unit of an audio processing apparatus. Referring to FIG. 14, an audio input unit 1501 inputs an audio signal from a microphone or an audio obtaining unit of an audio reproduction apparatus or the like. To the audio input unit 1501, an audio signal from which a DC component is removed is input. Therefore, an audio signal which assumes positive and negative values to have zero as the center is input. Note that in this specification, "audio signal" includes various sounds in addition to a human voice. An amplitude adjustment unit 1502 adjusts an amplitude of the input audio signal using a gain 1507, and outputs the adjusted audio signal to an audio output unit 1503. An amplitude level determination unit 1509 determines an amplitude level of the audio signal of the audio output unit 1503. A zero-crossing detection unit 1504 detects zero-crossings of values of the audio signal of the audio input unit 1501. An attack sound determination unit 1510 measures a period from when an amplitude level 1508 output from the amplitude level determination unit 1509 is immediately increased until it is decreased, and determines whether or not that sound is an attack sound. An amplitude gain decision unit 1506 controls the amplitude level 1508 based on a zero-crossing detection result 1505, the amplitude level 1508, and an attack sound determination result 1511 to fall within a range between a lower limit value TH_MIN and upper limit value TH_MAX. With this control, the amplitude gain decision unit 1506 decides the gain of the amplitude adjustment unit 1502, and outputs the gain 1507.

Figure 15:
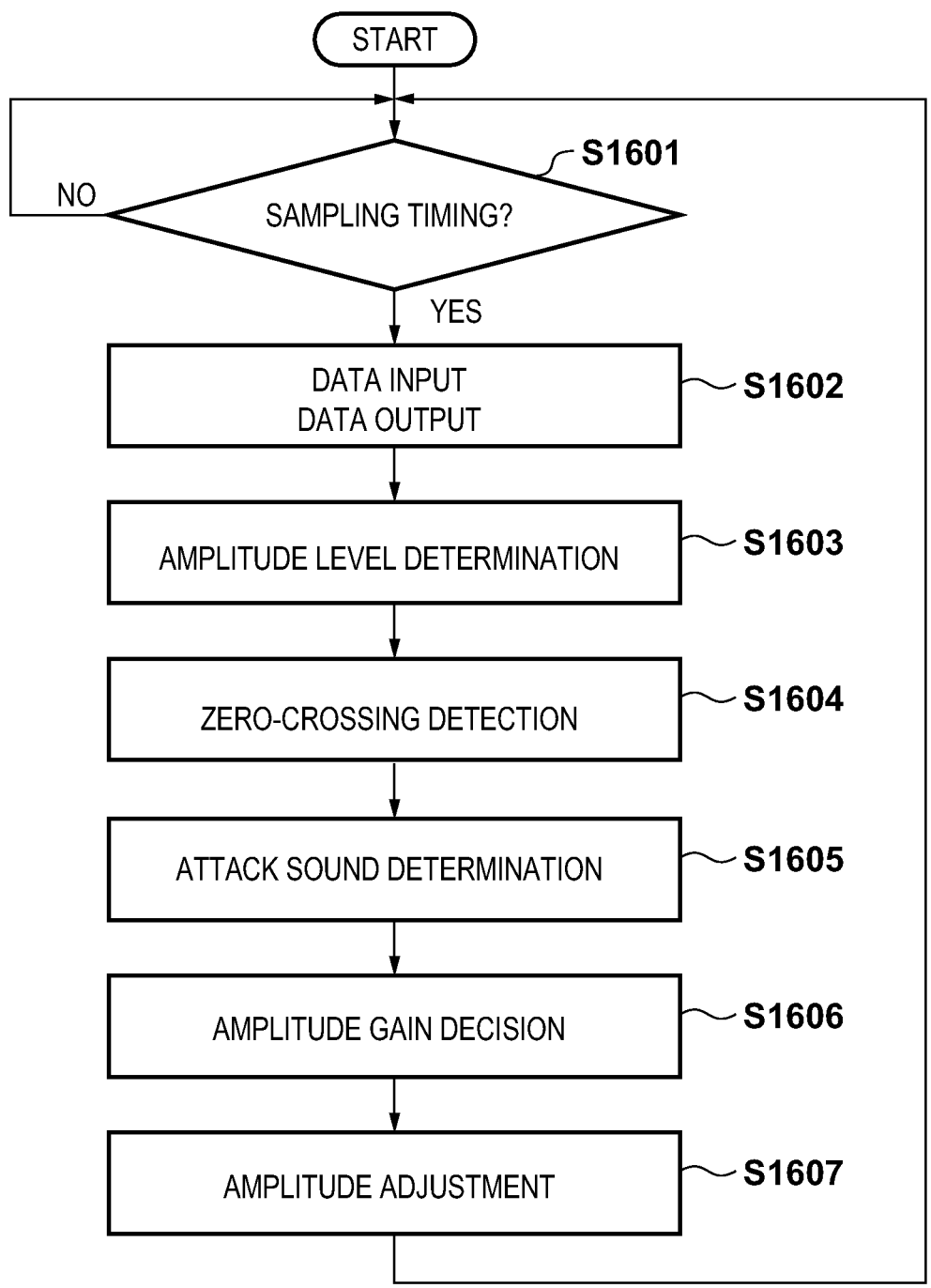
FIG. 15 is a flowchart showing the operation of the ALC unit shown in FIG. 14.

The operation of the ALC unit shown in FIG. 14 will be described below. A case will be described below wherein an audio is converted into a digital signal at a sampling frequency Fs, but the same applies to an analog signal. FIG. 15 is a flowchart showing the operation of the ALC unit shown in FIG. 14. It is determined whether or not the current time is a sampling timing (step S1601). If the current time is a sampling timing, an audio signal is input from the audio input unit 1501, and an audio signal is output to the audio output unit 1503 (step S1602). Next, the amplitude level determination unit 1509 executes amplitude level determination of the audio signal (step S1603), and the zero-crossing detection unit 1504 executes zero-crossing detection of the audio signal (step S1604). Next, the attack sound determination unit 1510 determines an attack sound (step S1605), and the amplitude gain decision unit 1506 decides an amplitude gain (step S1606). After that, the amplitude adjustment unit 1502 executes amplitude adjustment of the audio signal using the gain 1507 as an output from the amplitude gain decision unit 1506 (step S1607), and the control then stands by until the next sampling timing.

Figure 3:
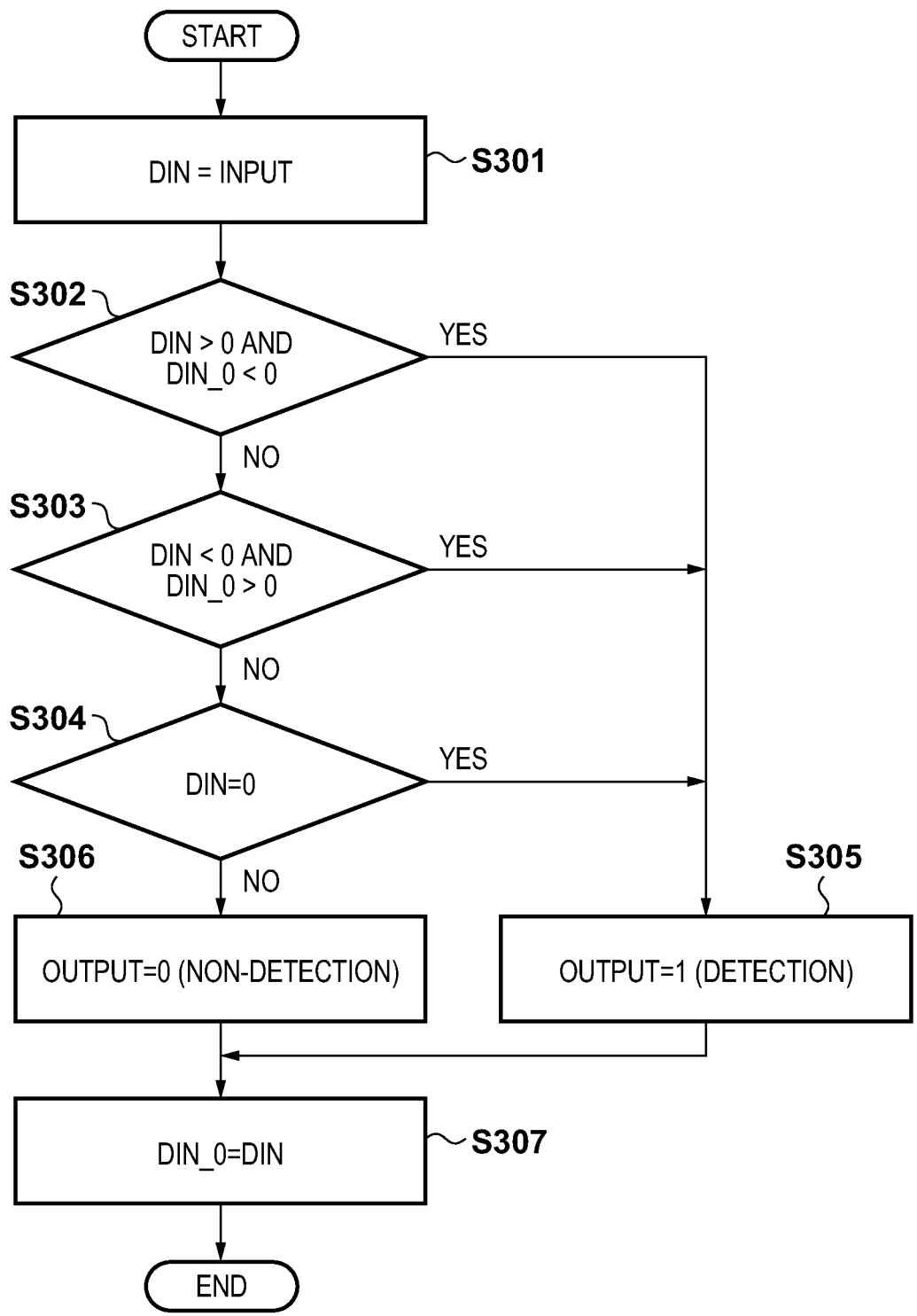
FIG. 3 is a flowchart showing the operation of a zero-crossing detection unit.

FIG. 3 is a flowchart showing the operation of the zero-crossing detection unit 1504. Initially, let DIN be a sample value of an audio signal input via the audio input unit 1501 (step S301). If DIN has a sign different from that of DIN_D as an input at a previous sampling timing, that is, if DIN>0 and DIN_D<0 (YES in step S302), a value "1" indicating zero-crossing detection is output as a zero-crossing detection result (step S305). Also, if DIN<0 and DIN_D>0 (YES in step S303), a value "1" indicating zero-crossing detection is output (step S305). Likewise, if DIN=0, a value "1" indicating zero-crossing detection is output (step S305). In other cases, a value "0" indicating zero-crossing non-detection is output as a zero-crossing detection result (step S306). The zero-crossing detection result 1505 obtained in this way is transferred to the amplitude gain decision unit 1506. Then, the current DIN is substituted in DIN_D for the next processing (step S307), thus ending the processing.

Figure 4:
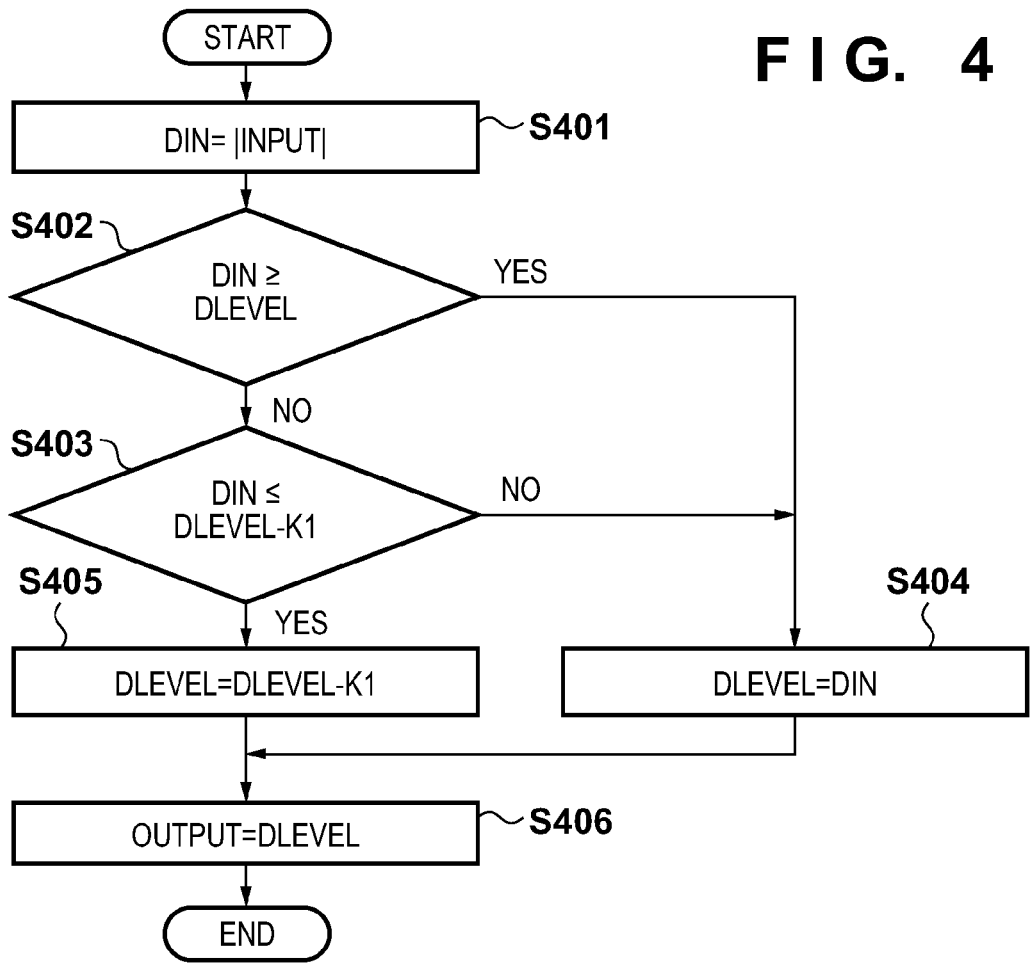
FIG. 4 is a flowchart showing the operation of an amplitude level determination unit.

FIG. 4 is a flowchart showing the operation of the amplitude level determination unit 1509. Initially, let DIN be an absolute value of an audio sample output from the amplitude adjustment unit 1502 to the audio output unit 1503 (step S401). It is determined whether or not DIN is not less than an amplitude level DLEVEL as a previous determination result (step S402). If DIN is not less than DLEVEL, DIN is substituted in DLEVEL (step S404). If DIN is less than DLEVEL in step S402, it is determined if DIN assumes a value obtained by subtracting K1 from the amplitude level DLEVEL as the previous determination result (step S403). If NO in step S403, DIN is substituted in DLEVEL (step S404). If YES in step S403, the value obtained by subtracting K1 from DLEVEL is substituted in DLEVEL (step S405). At this time, it is limited so that DLEVEL is not smaller than DIN. Then, DLEVEL obtained in this way is output as the current amplitude level 1508 (step S406). With the above control, since an envelope value of the audio signal is obtained, it is set as an amplitude level. The audio sample input in step S401 may be processed intact, but its absolute value can be calculated since a larger level can be reflected even when positive and negative levels are asymmetric, thus improving the ALC performance.

Figure 16:
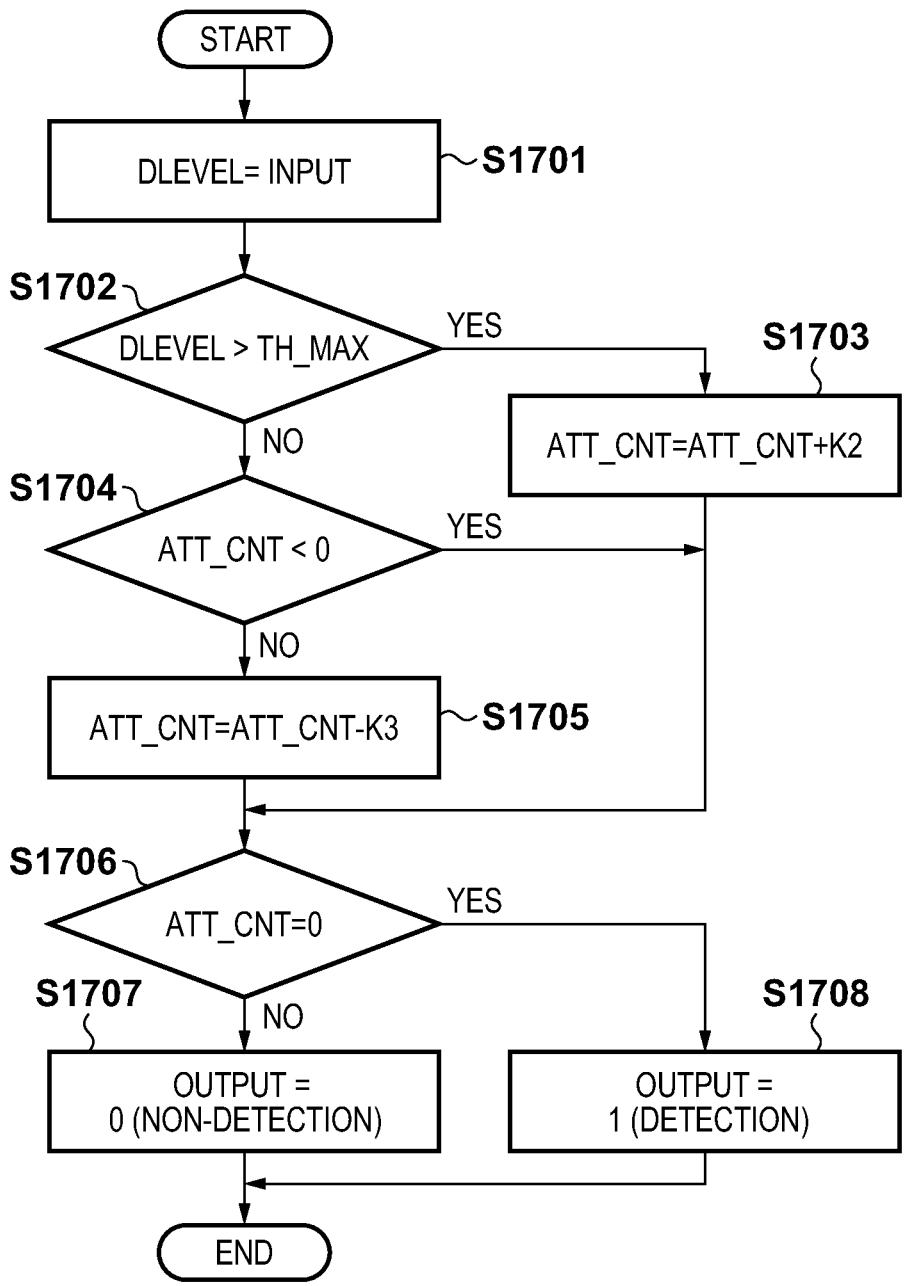
FIG. 16 is a flowchart showing the operation of an attack sound determination unit.

FIG. 16 is a flowchart showing the operation of the attack sound determination unit 1510. In order to change a gain change amount according to a period of a large audio when a large audio is changed to a small audio upon adjusting an amplitude by the amplitude adjustment unit 1502, a short, large audio (attack sound) is determined. Initially, let DLEVEL be an amplitude level 1508 determined by the amplitude level determination unit 1509 (step S1701). If DLEVEL is larger than a threshold TH_MAX (YES in step S1702), a fixed value K2 is added to ATT_CNT (step S1703). If DLEVEL is equal to or smaller than TH_MAX (NO in step S1702), a fixed value K3 is subtracted from ATT_CNT (step S1705) until ATT_CNT=0 (until YES is determined in step S1704). When an audio becomes suddenly large, ATT_CNT is kept increased by K2 until the ALC decreases the amplitude level to be not more than TH_MAX (step S1703). After that, if the amplitude level is not more than TH_MAX, ATT_CNT is decreased by K3 (step S1705). Therefore, it is determined whether or not ATT_CNT=0 (step S1706), and if ATT_CNT=0, "0" which represents attack sound non-detection is output (step S1707); if ATT_CNT≠0, "1" which represents attack sound detection is output (step S1708).

FIG. 17 is a flowchart showing the operation of the amplitude gain decision unit 1506. The amplitude gain decision unit 1506 controls the amplitude level 1508 to fall within a range between TH_MIN and TH_MAX (for TH_MIN<TH_MAX). An operation for increasing the gain 1507 when the amplitude level 1508 is smaller than TH_MIN will be referred to as a recovery operation hereinafter, and an operation for decreasing the gain 1507 when the amplitude level 1508 is larger than TH_MAX will be referred to as a limit operation hereinafter. In the flowchart shown in FIG. 17, a variable GAIN represents the gain 1507 to be output. Also, S_CNT is a variable which represents a sample frequency timing counter. S_CNT=0 at the beginning of an M_LIMIT mode or M_RECOV mode, and S_CNT is counted up at every sample frequency timing.

The amplitude gain decision unit 1506 respectively inputs the zero-crossing detection result 1505, amplitude level 1508, and attack sound determination result 1511 to a variable Z_DET, DLEVEL, and ATT_DET (step S1801). After that, the amplitude gain decision unit 1506 determines a mode (MODE), and then executes processing according to the determined mode. MODE includes three modes, that is, M_IDLE, M_LIMIT, and M_RECOV. MODE=M_RECOV at the time of the recovery operation, and MODE=M_LIMIT at the time of the limit operation. Also, when the amplitude level falls within the range between TH_MIN and TH_MAX, MODE=M_IDLE to maintain the gain. M_LIMIT and M_RECOV require one to plural sample periods for processing.

When MODE=M_IDLE, if an amplitude level DLEVEL of the current audio amplitude level DLEVEL>TH_MAX (YES in step S1803), MODE is changed to MODE=M_LIMIT (step S1804), and the process returns to step S1802. On the other hand, if DLEVEL<TH_MIN (YES in step S1805), MODE is changed to MODE=M_RECOV, and the process returns to step S1802. If DLEVEL falls within the range between TH_MIN and TH_MAX (NO in step S1803 and NO in step S1805), the value of GAIN is output intact as the gain 1507 (step S1807), thus ending the processing.

When MODE=M_RECOV, the recovery operation is executed. However, if DLEVEL exceeds TH_MAX (YES in step S1808), MODE is changed to M_LIMIT to execute the limit operation (step S1809). This is because if the limit operation is not executed at all until the recovery operation ends, an audio signal becomes too large and may possibly be distorted. If MODE is changed from M_RECOV to M_LIMIT, S_CNT is reset to zero (step S1809).

When MODE=M_LIMIT, C_MIN, C_MAX, and ADD_GAIN are respectively set in L_C_MAIN, L_C_MAX, and L_ADD_GAIN (step S1810).

When MODE=M_RECOV, if DLEVEL does not exceed TH_MAX (NO in step S1808), the attack sound detection result is determined (step S1811). If the attack sound detection result indicates attack sound non-detection (ATT_DET=0) (NO in step S1811), C_MIN, C_MAX, and ADD_GAIN are respectively set in R_C_MAIN, R_C_MAX, and R_ADD_GAIN (step S1812). On the other hand, if the attack sound detection result indicates attack sound detection (ATT_DET=1) (YES in step S1811), C_MIN, C_MAX, and ADD_GAIN are respectively set in ATT_C_MAIN, ATT_C_MAX, and ATT_ADD_GAIN (step S1813). The recovery operation at the time of attack sound detection will be referred to as a "fast recovery operation" hereinafter. C_MIN is a parameter required to set a minimum sample period for changing the gain, and is normally set under the condition C_MIN<C_MAX. However, if the zero-crossing detection result is not used, C_MIN can assume an arbitrary value.

If S_CNT>C_MAX (YES in step S1814), the value of GAIN is updated to a value obtained by adding ADD_GAIN to the current value of GAIN (step S1815). If S_CNT>C_MIN and Z_DET=1 (zero-crossing detection) (YES in step S1816), the value of GAIN is similarly updated to a value obtained by adding ADD_GAIN to the current value of GAIN (step S1815). After that, S_CNT is reset to zero, and MODE is changed to M_IDLE (step S1817), and GAIN is output (step S1807), thus ending the processing. Otherwise, S_CNT is incremented by "1" (step S1818), and GAIN is output while maintaining MODE (step S1807), thus ending the processing.

In the aforementioned processing, C_MIN corresponds to a GAIN change time constant. As C_MIN becomes larger, much time is required until DLEVEL falls within the range between TH_MIN and TH_MAX. This corresponds to an increase in GAIN change time constant. C_MAX serves as a limiter which limits the GAIN change time constant not to be too large in case of a low-frequency audio signal. GAIN is changed by adding ADD_GAIN to GAIN (step S1815). Therefore, at the time of M_LIMIT (limit operation), ADD_GAIN assumes a minus value, and at the time of M_RECOV (recovery operation), ADD_GAIN assumes a plus value.

A gain change amount is preferably as small as possible to reduce an influence on sound quality. Hence, the following condition is set in this case.

$$R\_ADD\_GAIN = -L\_ADD\_GAIN1 = ATT\_ADD\_GAIN2$$

Note that R_ADD_GAIN is a positive value. At the time of the limit operation, since an audio signal level becomes large and is distorted, the gain can be decreased as quickly as possible. On the other hand, at the time of the recovery operation, the gain can be increased as slowly as possible so as to obscure a level variation. Hence, the following condition is set.

$$R\_C\_MIN > L\_C\_MIN$$

Furthermore, in case of an attack sound, it is desired to recover an audio level immediately after the attack sound to a proper level by reducing a time constant of the recovery operation. Hence, the following condition is set.

$$R\_C\_MIN > ATT\_C\_MIN$$

FIG. 18A shows charts of the ALC operation when an input sound is an attack sound, and FIG. 18B shows charts of the ALC operation when it is not an attack sound. "Input audio envelope" represents an envelope waveform of an audio signal input to the audio input unit 1501, and FIG. 18A indicates an attack sound, an amplitude level of which becomes suddenly large, and becomes small soon after. By contrast, FIG. 18B shows an audio signal which is not an attack sound, and an amplitude level of which becomes suddenly large but becomes small after a while. "Output audio envelope" is an envelope waveform of an audio signal of the audio output unit 1503, and is an output after execution of the ALC. "Gain" shows a change in gain 1507 decided by the amplitude gain decision unit 1506. "ATT_CNT" shows a change in ATT_CNT calculated by the attack sound determination unit 1510 according to the sequence shown in FIG. 16. As described above, the recovery operation at the time of attack sound detection is called "fast recovery operation". Since attack sound detection is determined when ATT_CNT>0 (step S1708), the fast recovery operation is executed during a period from T3a to T4a in FIG. 18A, and a normal recovery operation is executed during a period from T4a to T5a. In FIG. 18B, since ATT_CNT=0 during the period from T3b to T4b, the normal recovery operation is executed in place of the fast recovery operation.

FIG. 19 shows charts of the ALC operation when a plurality of attack sounds are successively input. Since the fast recovery operation is executed during a fast recovery period shown in FIG. 19, the gain change time constant when an input becomes small is small and recovers quickly. For this reason, since the recovery operation ends before the next attack sound is input, when attack sounds are input successively, responses of the plurality of attack sounds are equal to each other, as shown in FIG. 19.

However, when attack sounds are successively input at short intervals, if a level gain is increased to be higher than usual in the recovery operation of one attack sound, an audio signal is clipped and distorted at a leading edge of each subsequent attack sound.

Hence, embodiments for solving such problems will be described hereinafter.

First Embodiment

Figure 1:
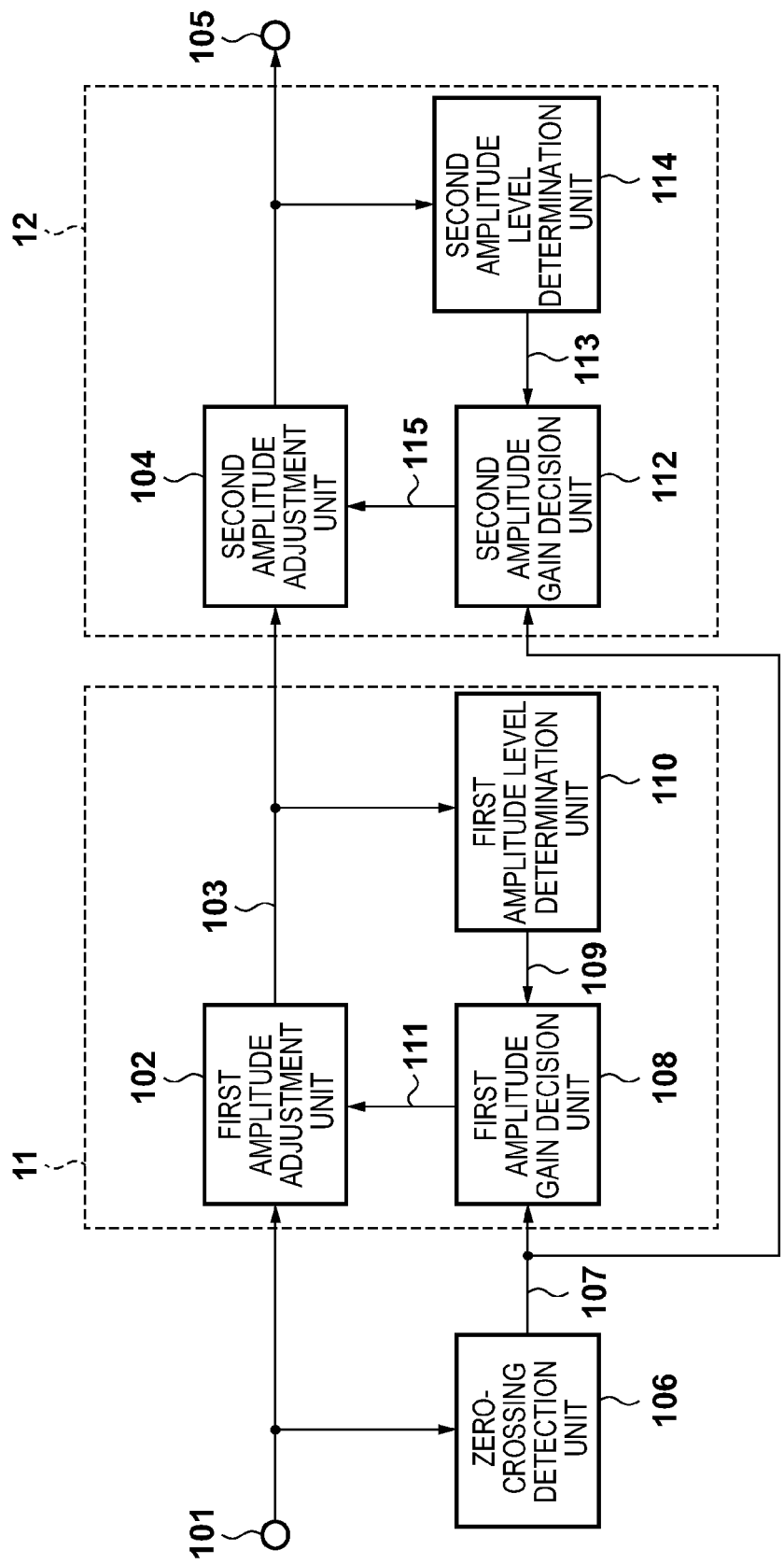
FIG. 1 is a block diagram showing the arrangement of an ALC unit of an audio processing apparatus according to the first embodiment.

FIG. 1 is a block diagram showing the arrangement of an ALC unit of an audio processing apparatus according to this embodiment. Referring to FIG. 1, an audio input unit 101 inputs an audio signal from a microphone, an audio reproduction apparatus, or the like. To the audio input unit 101, an audio signal from which a DC component is removed is input. Therefore, an audio signal which assumes positive and negative values to have zero as the center is input. The ALC unit of this embodiment includes a first ALC function unit 11 and a second ALC function unit 12 arranged after the first ALC function unit 11, as shown in FIG. 1. From an audio output unit 105, an audio signal, an amplitude level of which is adjusted to fall within a range between TH_MIN and TH_MAX (for TH_MIN<TH_MAX), is output.

The first ALC function unit 11 as a first level control unit includes a first amplitude adjustment unit 102, first amplitude gain decision unit 108, and first amplitude level determination unit 110. The second ALC function unit 12 as a second level control unit includes a second amplitude adjustment unit 104, second amplitude gain decision unit 112, and second amplitude level determination unit 114. The ALC unit of this embodiment further includes a zero-crossing detection unit 106. Note that the zero-crossing detection unit 106 is not indispensable although it is advantageous to arrange that unit 106 for the purpose of sound quality enhancement.

The first ALC function unit 11 will be described first. The first amplitude adjustment unit 102 amplifies or attenuates an audio signal from the audio input unit 101 according to a gain 111 decided by the first amplitude gain decision unit 108. The first amplitude level determination unit 110 determines an amplitude level of an output signal 103 of the first amplitude adjustment unit 102. The first amplitude gain decision unit 108 decides the gain 111 to be provided to the first amplitude adjustment unit 102 according to an amplitude level 109 determined by the first amplitude level determination unit 110 and a zero-crossing detection result 107 from the zero-crossing detection unit 106.

When the first amplitude gain decision unit 108 changes the gain 111 at a timing at which an absolute value of an amplitude level of an audio signal from the audio input unit 101 is large, an audio waveform is unwantedly stepped, thus deteriorating sound quality. Thus, in this embodiment, the zero-crossing detection unit 106 detects a point where an amplitude level of an audio signal from the audio input unit 101 crosses a zero level (to be referred to as "zero-crossing" hereinafter), and the first amplitude gain decision unit 108 changes the gain 111 at that timing. Thus, sound quality deterioration can be minimized. This uses the fact that an absolute value of an amplitude level of an audio signal tends to be small at the zero-crossing timing. The zero-crossing detection result 107 is provided to the first amplitude gain decision unit 108. The first amplitude gain decision unit 108 changes the gain 111 based on that zero-crossing detection result 107. Also, the first amplitude gain decision unit 108 controls the gain 111 so that the amplitude level 109 received from the first level determination unit 110 falls within the range between TH_MIN and TH_MAX (for TH_MIN<TH_MAX).

The second ALC function unit 12 will be described below. The second amplitude adjustment unit 104 amplifies or attenuates the output signal 103 of the first amplitude adjustment unit 102 according to a gain 115 decided by the second amplitude gain decision unit 112. The second amplitude level determination unit 114 determines an amplitude level of an output signal of the second amplitude adjustment unit 104. The second amplitude gain decision unit 112 decides the gain 115 to be provided to the second amplitude adjustment unit 104 based on an amplitude level 113 determined by the second amplitude level determination unit 114 and the zero-crossing detection result 107.

As in the first ALC function unit 11, the second amplitude gain decision unit 112 changes the gain 115 at, for example, the zero-crossing timing detected by the zero-crossing detection unit 106. The output signal 103 of the first amplitude adjustment unit 102 is obtained by only adjusting an amplitude of an audio signal input to the audio input unit 101, and the zero-crossing timing of the output signal 103 is equal to that of the audio signal input to the audio input unit 101. Hence, the zero-crossing detection result 107 used in the first ALC function unit 11 is utilized. That is, the zero-crossing detection result 107 is also transferred to the second amplitude gain decision unit 112. The second amplitude gain decision unit 112 changes the gain 115 based on the zero-crossing detection result 107. Also, the second amplitude gain decision unit 112 controls the gain 115 so that the amplitude level 113 received from the second amplitude level determination unit 114 falls within a range between TH_MIN and TH_MAX (for TH_MIN<TH_MAX).

The operations of the respective units will be described below using the flowcharts. The processing of the ALC unit according to this embodiment can be implemented by either digital signal processing or analog signal processing. In this embodiment, a case will be described below wherein an analog audio signal is converted into a digital signal using a sampling frequency Fs. Therefore, an audio signal converted into a digital signal is input to the audio input unit 101, and a digital audio signal is output from the audio output unit 105.

Figure 2:
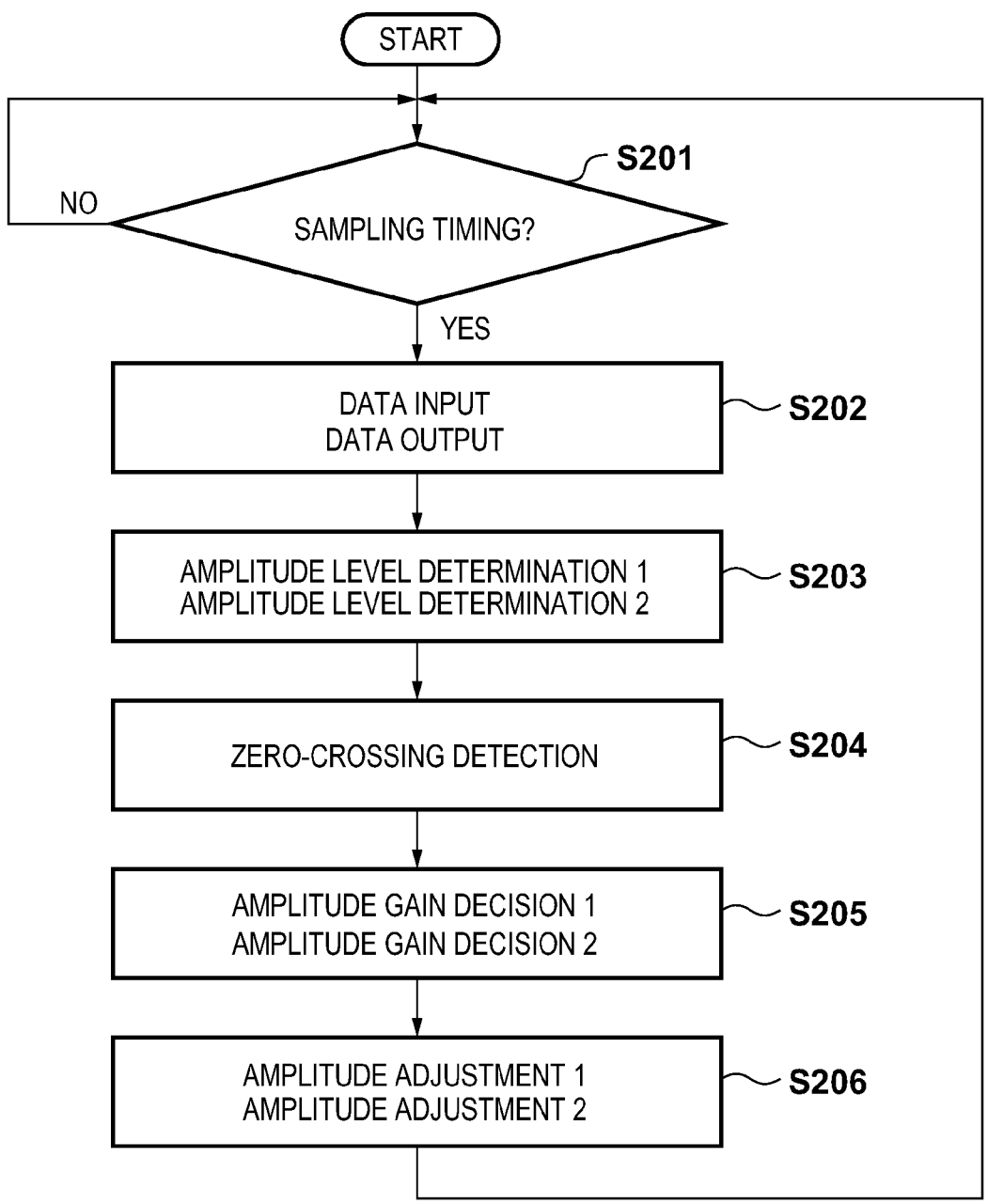
FIG. 2 is a flowchart showing the operation of the ALC unit according to the first embodiment.

FIG. 2 is a flowchart showing the operation of the ALC unit shown in FIG. 1. It is determined whether or not the current time is a sampling timing (step S201). If the current time is a sampling timing, an audio signal is input from the audio input unit 101, and an audio signal is output to the audio output unit 105 (step S202). Next, the first and second amplitude level determination units 110 and 114 execute amplitude level determination (step S203), and the zero-crossing detection unit 106 executes zero-crossing detection (step S204). Next, the first and second amplitude gain decision units 108 and 112 decide amplitude gains (step S205). After that, the first amplitude adjustment unit 102 executes amplitude adjustment using the decided gain 111, and the second amplitude adjustment unit 104 executes amplitude adjustment using the decided gain 115 (step S206). Then, the control waits until the next sampling timing.

The operation of the zero-crossing detection unit 106 is the same as that of the zero-crossing detection unit 1504, and is executed according to the flowchart shown in FIG. 3. Also, the operations of the first and second amplitude level determination units 110 and 114 are the same as that of the amplitude level determination unit 1509, and are executed according to the flowchart shown in FIG. 4.

Figure 5:
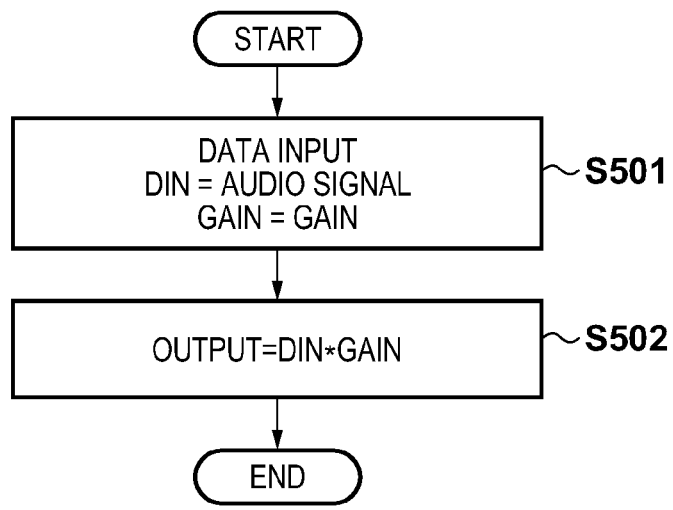
FIG. 5 is a flowchart showing the operation of first and second amplitude adjustment units according to the first embodiment.

FIG. 5 is a flowchart showing the operations of the first and second amplitude adjustment units 102 and 104. In this case, the operation of the first amplitude adjustment unit 102 will be explained. The same applies to the operation of the second amplitude adjustment unit 104. Initially, a sample value of an input audio signal is set as a variable DIN, and the gain 111 is input to a variable GAIN (step S501). Next, DIN*GAIN is calculated to output that product (step S502). When GAIN is expressed as a decibel of a LOG scale, it is converted into a ratio ($10^{(GAIN/20)}$). Various conversion methods such as a combination of a table and shift calculation are available, and arbitrary methods can be used.

Figure 6:
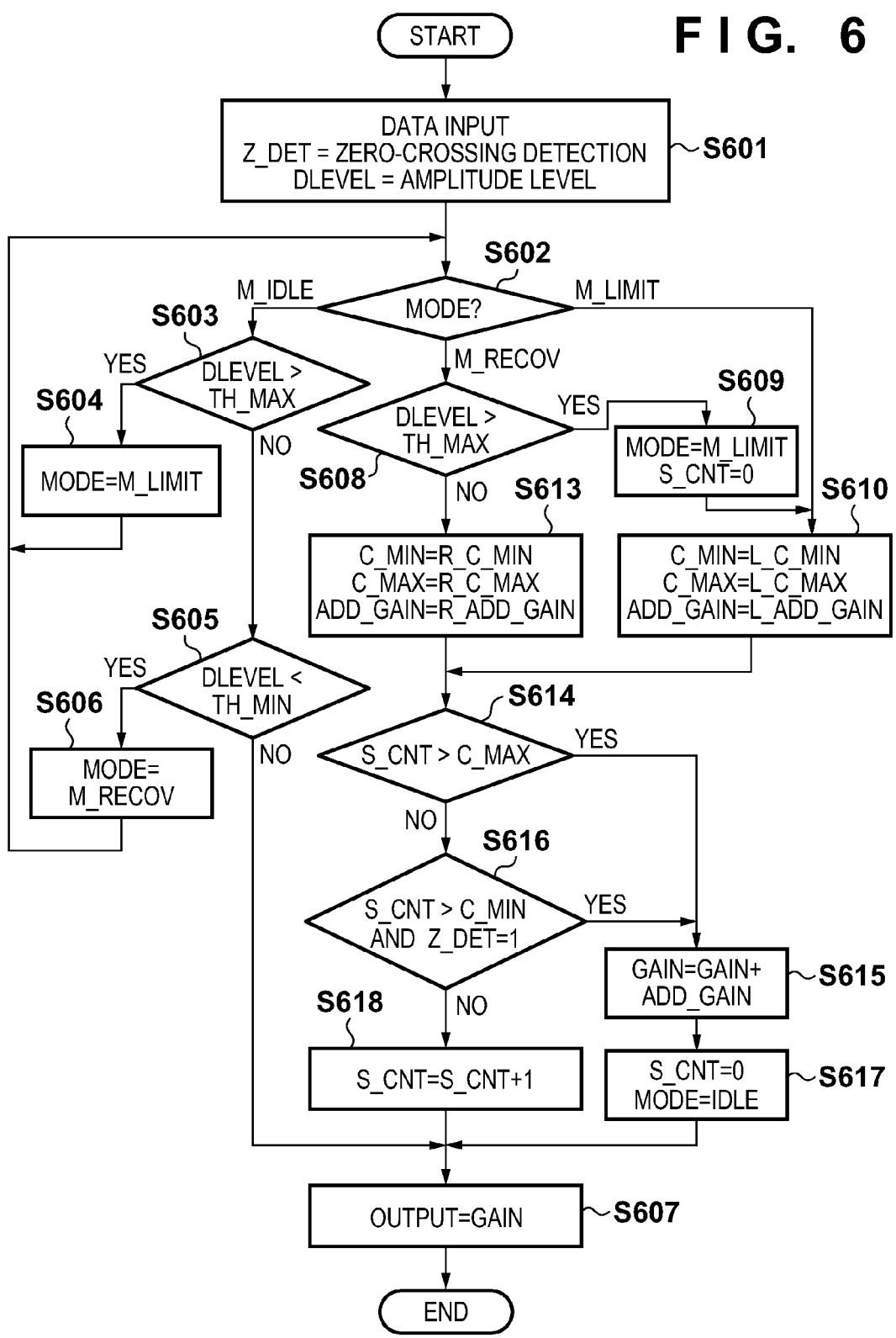
FIG. 6 is a flowchart showing the operation of a first amplitude gain decision unit according to the first embodiment.

FIG. 6 is a flowchart showing the operation of the first amplitude gain decision unit 108. The first amplitude gain decision unit 108 controls the amplitude level 109 to fall within the range between TH_MIN and TH_MAX (for TH_MIN<TH_MAX). As described above, the operation for increasing the gain 111 when the amplitude level 109 is smaller than TH_MIN is called the recovery operation, and the operation for decreasing the gain 111 when the amplitude level 109 is larger than TH_MAX is called the limit operation. In the flowchart shown in FIG. 6, a variable GAIN represents the gain 111 to be output. Also, S_CNT is a variable which represents a sample frequency timing counter. S_CNT is zero at the beginning of the M_LIMIT mode or M_RECOV mode, and is counted up at every sample frequency timing.

Initially, the first amplitude gain decision unit 108 respectively inputs the zero-crossing detection result 107 and amplitude level 109 to variables Z_DET and DLEVEL (step S601). After that, the first amplitude gain decision unit 108 determines a mode (MODE), and executes processing according to the determination result. MODE includes three modes, that is, M_IDLE, M_LIMIT, and M_RECOV. MODE=M_RECOV at the time of the recovery operation, and MODE=M_LIMIT at the time of the limit operation. Also, when the amplitude level falls within the range between TH_MIN and TH_MAX, MODE=M_IDLE to maintain the gain. M_LIMIT and M_RECOV require one to plural sample periods for processing.

When MODE=M_IDLE, if an amplitude level DLEVEL of the current audio amplitude level DLEVEL>TH_MAX (YES in step S603), MODE is changed to MODE=M_LIMIT (step S604), and the process returns to step S602. On the other hand, if DLEVEL<TH_MIN (YES in step S605), MODE is changed to MODE=M_RECOV, and the process returns to step S602. If DLEVEL falls within the range between TH_MIN and TH_MAX (NO in step S603 and NO in step S605), the value of GAIN is output intact as the gain 111 (step S607), thus ending the processing.

When MODE=M_RECOV, the recovery operation is executed. However, if DLEVEL exceeds TH_MAX (YES in step S608), MODE is changed to M_LIMIT to execute the limit operation (step S609). This is because if the limit operation is not executed at all until the recovery operation ends, an audio signal becomes too large and may possibly be distorted. If MODE is changed from M_RECOV to M_LIMIT, S_CNT is reset to zero (step S609).

When MODE=M_LIMIT, C_MIN, C_MAX, and ADD_GAIN are respectively set in L_C_MAIN, L_C_MAX, and L_ADD_GAIN (step S610).

When MODE=M_RECOV, if DLEVEL does not exceed TH_MAX (NO in step S608), C_MIN, C_MAX, and ADD_GAIN are respectively set in R_C_MAIN, R_C_MAX, and R_ADD_GAIN (step S613).

C_MIN is a parameter required to set a minimum sample period for changing the gain, and is normally set under the condition C_MIN<C_MAX. However, if the zero-crossing detection result is not used, C_MIN can assume an arbitrary value.

If S_CNT>C_MAX (YES in step S614), the value of GAIN is updated to a value obtained by adding ADD_GAIN to the current value of GAIN (step S615). If S_CNT>C_MIN and Z_DET=1 (zero-crossing detection) (YES in step S616), the value of GAIN is similarly updated to a value obtained by adding ADD_GAIN to the current value of GAIN (step S615). After that, S_CNT is reset to zero, and MODE is changed to M_IDLE (step S617), thus ending the processing. Otherwise, S_CNT is incremented by "1" (step S618), and GAIN is output while maintaining MODE (step S607), thus ending the processing.

In the aforementioned processing, C_MIN corresponds to a GAIN change time constant. As C_MIN becomes larger, much time is required until DLEVEL falls within the range between TH_MIN and TH_MAX. This corresponds to an increase in GAIN change time constant. C_MAX serves as a limiter which limits the GAIN change time constant not to be too large in case of a low-frequency audio signal. GAIN is changed by adding ADD_GAIN to GAIN (step S615). Therefore, at the time of M_LIMIT (limit operation), ADD_GAIN assumes a minus value, and at the time of M_RECOV (recovery operation), ADD_GAIN assumes a plus value.

The operation sequence of the first amplitude gain decision unit 108 has been described. The operation sequence of the second amplitude gain decision unit 112 is the same as that of the first amplitude gain decision unit 108.

However, R_C_MIN, R_C_MAX, R_ADD_GAIN, L_C_MIN, L_C_MAX, and L_ADD_GAIN respectively assume different values between the first and second ALC function units 11 and 12. Let R_C_MIN1, R_C_MAX1, R_ADD_GAIN1, L_C_MIN1, L_C_MAX1, and L_ADD_GAIN1 be values on the first ALC function unit 11 side. On the other hand, let R_C_MIN2, R_C_MAX2, R_ADD_GAIN2, L_C_MIN2, L_C_MAX2, and L_ADD_GAIN2 be values on the second ALC function unit 12 side. In this case, for example, by adopting the following settings, a satisfactory ALC operation can be implemented even when attack sounds are successively input.

A gain change amount is preferably as small as possible to reduce an influence on sound quality. Hence, in this embodiment, the following relation is set.

$$R\_ADD\_GAIN1 = -L\_ADD\_GAIN1 = R\_ADD\_GAIN2 = -L\_ADD\_GAIN2$$

Note that R_ADD_GAIN1 is a positive value.

At the time of the limit operation, since an audio signal level becomes large and is distorted, the gain can be decreased as quickly as possible. On the other hand, at the time of the recovery operation, the gain can be increased as slowly as possible so as to obscure a level variation. Hence, the following relations are set.

$$R\_C\_MIN1 > L\_C\_MIN1, \text{ and}$$

$$R\_C\_MIN2 > L\_C\_MIN2$$

By setting a gain increase time constant at the time of the recovery operation of the first ALC function unit 11 to be larger than that of the second ALC function unit 12, satisfactory characteristics can be obtained when attack sounds are input successively. Therefore, the following relation is set.

$$R\_C\_MIN1 > R\_C\_MIN2$$

As for a gain change at the time of the limit operation, an operation changes depending on setting values, but no problem is posed if the following relation is approximately set.

$$L\_C\_MIN1 \geq L\_C\_MIN2$$

(L_C_MIN1<L_C_MIN2 may be set.)

When zero-crossing detection is skipped, the following relations are set.

$$R\_C\_MIN1 = R\_C\_MAX1,$$

$$L\_C\_MIN1 = L\_C\_MAX1,$$

$$R\_C\_MIN2 = R\_C\_MAX2, \text{ and}$$

$$L\_C\_MIN2 = L\_C\_MAX2$$

Thus, the operation is made independently of Z_DET.

Figure 7:
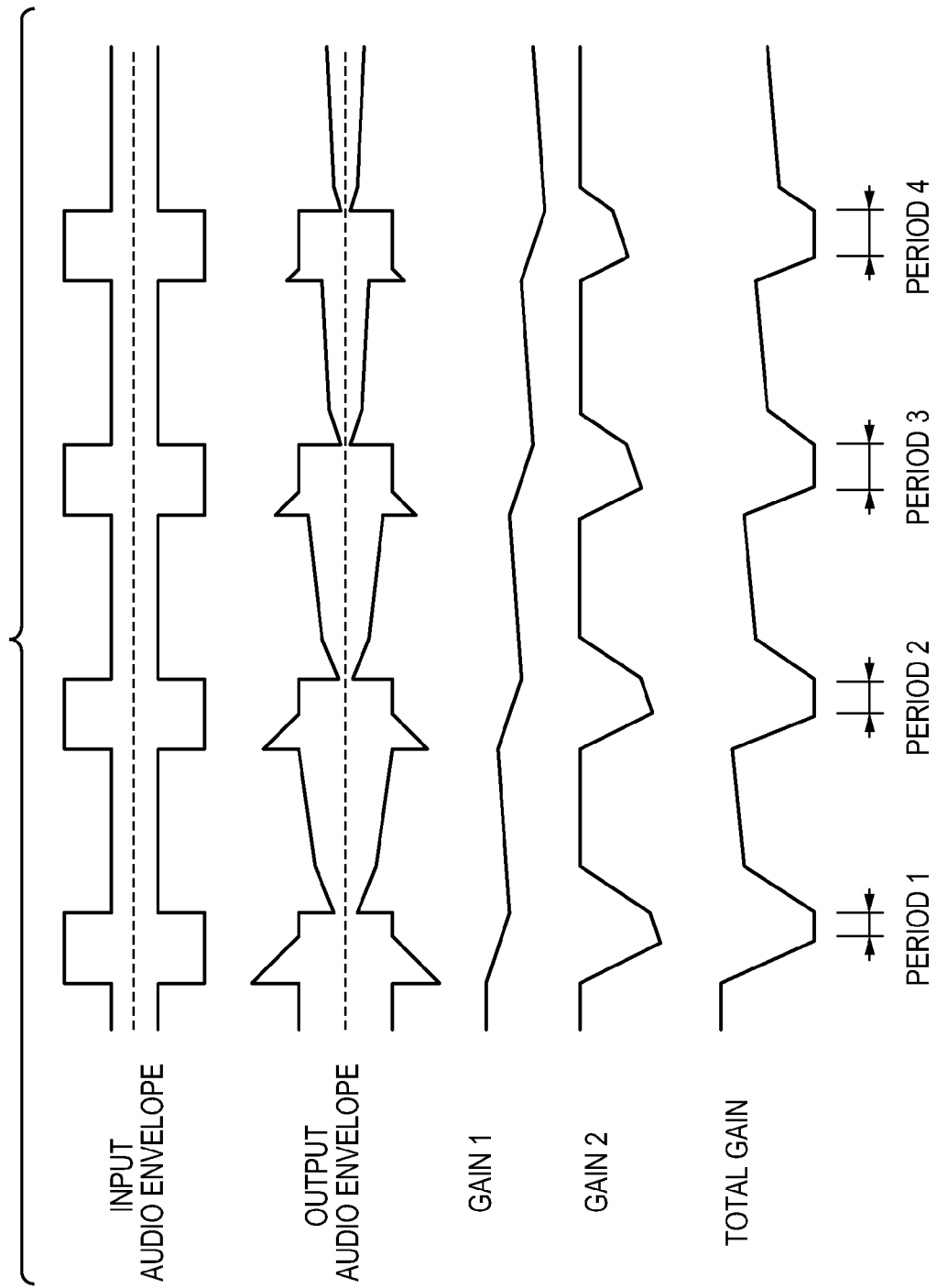
FIG. 7 shows charts of the ALC operation when a plurality of attack sounds are successively input in the first embodiment.

FIG. 7 shows the operation when a plurality of attack sounds are successively input in a case of L_C_MIN1>L_C_MIN2 in this embodiment. In FIG. 7, "Input audio envelope" represents an envelope waveform of an audio signal input to the audio input unit 101, and a plurality of attack sounds are successively input. "Output audio envelope" is an envelope waveform of an audio signal output to the audio output unit 105, and is that of an audio signal after execution of the ALC of this embodiment. "Gain 1" shows a change in gain 111 decided by the first amplitude gain decision unit 108, and "gain 2" shows a change in gain 115 decided by the second amplitude gain decision unit 112. "Total gain" is a total value of gains 1 and 2, and corresponds to a gain of the entire ALC unit.

Since R_C_MIN1>R_C_MIN2, when attack sounds are successively input, gain 1 is decreased, and a change ratio of a value of gain 2 on the second ALC function unit 12 side, which responds quickly, is decreased in a part where the amplitude of the input audio envelope increases abruptly. For this reason, when attack sounds are successively input, a distortion of an output audio in an inrush part of each attack sound can be suppressed. Note that when only one attack sound is input, since the recovery operation is executed based on a quick time constant on the second ALC function unit 12, characteristics equivalent to the conventional apparatus can be obtained.

Second Embodiment

Figure 8:
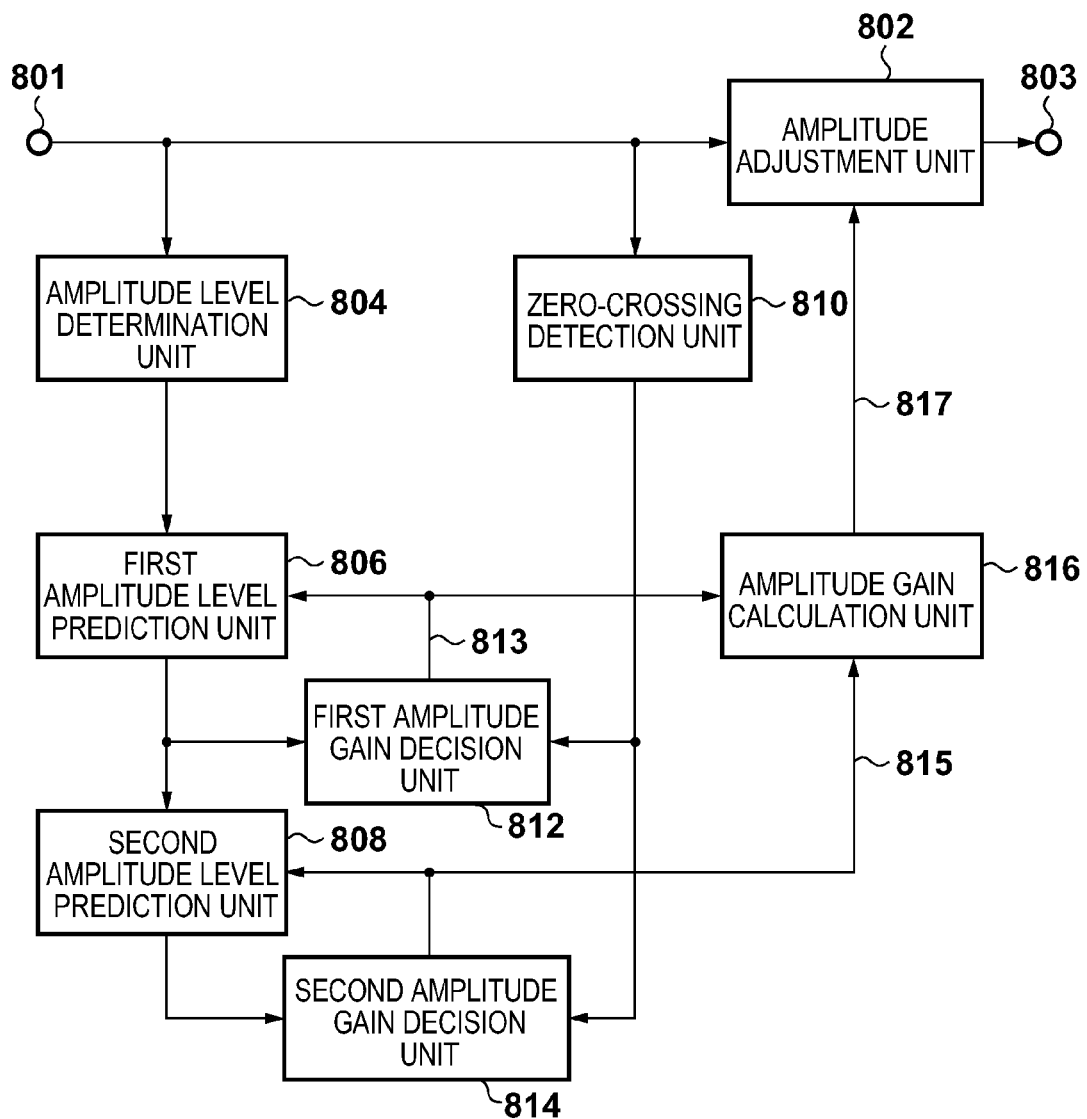
FIG. 8 is a block diagram showing the arrangement of an ALC unit of an audio processing apparatus according to the second embodiment.

FIG. 8 is a block diagram showing the arrangement of an ALC unit of an audio processing apparatus according to the second embodiment. In FIG. 8, an audio input unit 801 inputs an audio signal from a microphone, an audio reproduction apparatus, or the like. To the audio input unit 801, an audio signal from which a DC component is removed is input. Therefore, an audio signal which assumes positive and negative values to have zero as the center is input. From an audio output unit 803, an audio signal, an amplitude level of which is adjusted to fall within a range between TH_MIN and TH_MAX (for TH_MIN<TH_MAX), is output.

This embodiment provides an operation equivalent to the first embodiment. In this embodiment, the ALC unit includes an amplitude level determination unit 804, amplitude adjustment unit 802, zero-crossing detection unit 810, and first and second amplitude gain decision units 812 and 814. The ALC unit of this embodiment further includes a first amplitude level prediction unit 806 as a first prediction unit, a second amplitude level prediction unit 808 as a second prediction unit, and an amplitude gain calculation unit 816.

Figure 9:
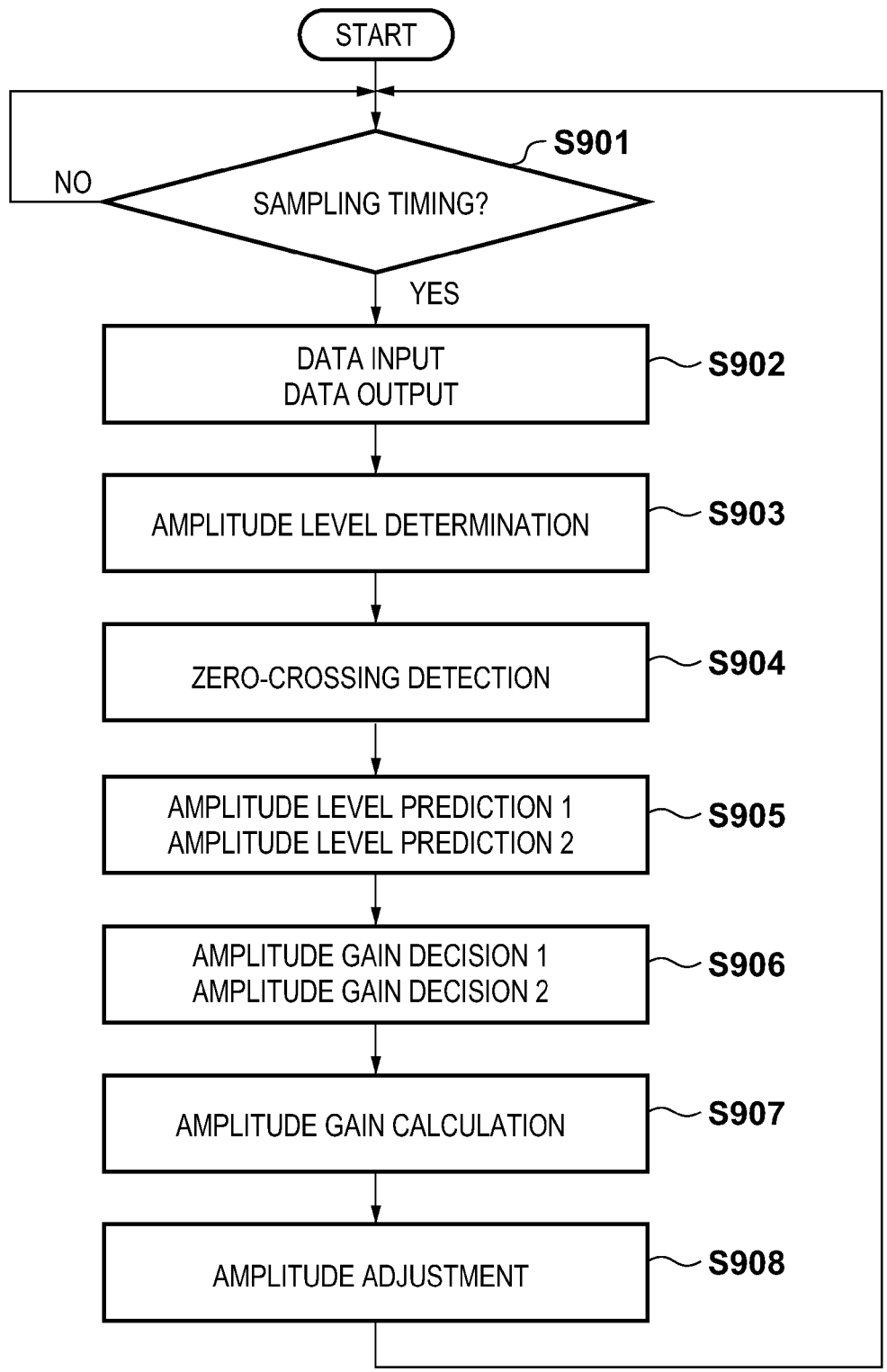
FIG. 9 is a flowchart showing the operation of the ALC unit according to the second embodiment.

FIG. 9 is a flowchart showing the operation of the ALC unit shown in FIG. 8. It is determined whether or not the current time is a sampling timing (step S901). If the current time is a sampling timing, an audio signal is input from the audio input unit 801, and an audio signal is output to the audio output unit 803 (step S902). Next, the amplitude level determination unit 804 executes amplitude level determination (step S903), and the zero-crossing detection unit 810 executes zero-crossing detection (step S904). Next, the first amplitude level prediction unit 806 executes amplitude level prediction, and the second amplitude level prediction unit 808 further executes amplitude level prediction (step S905). Next, the first gain decision unit 812 as a first gain control unit and the second gain decision unit 814 as a second gain control unit decide amplitude gains (step S906). After that, the amplitude gain calculation unit 816 adds a first gain 813 decided by the first gain decision unit 812 and a second gain 815 decided by the second gain decision unit 814 (step S907). Then, the amplitude adjustment unit 802 executes amplitude adjustment using a total gain 817 as the sum (step S908). Then, the control waits until the next sampling timing.

The operation of the zero-crossing detection unit 810 is the same as that of the zero-crossing detection unit 1504, and is executed according to the flowchart shown in FIG. 3. Also, the operations of the amplitude level determination unit 804 is the same as that of the amplitude level determination unit 1509, and are executed according to the flowchart shown in FIG. 4. The operation of the amplitude adjustment unit 802 is the same as those of the first and second amplitude adjustment unit 102 and 104 of the first embodiment, and is executed according to the flowchart shown in FIG. 5. The operations of the first and second amplitude gain decision units 812 and 814 are the same as those of the first and second amplitude gain decision units 108 and 112, and are executed according to the flowchart shown in FIG. 6.

R_C_MIN, R_C_MAX, R_ADD_GAIN, L_C_MIN, L_C_MAX, and L_ADD_GAIN respectively assume different values between the first and second amplitude gain decision units 812 and 814. Let R_C_MIN1, R_C_MAX1, R_ADD_GAIN1, L_C_MIN1, L_C_MAX1, and L_ADD_GAIN1 be values on the first amplitude gain decision unit 812 side. On the other hand, let R_C_MIN2, R_C_MAX2, R_ADD_GAIN2, L_C_MIN2, L_C_MAX2, and L_ADD_GAIN2 be values on the second amplitude gain decision unit 814 side. When these values are set in the same manner as in the first embodiment, a satisfactory ALC operation can be implemented even when attack sounds are successively input.

Third Embodiment

In the aforementioned second embodiment, a total gain 817 is desirably constant during periods 1 to 4 in FIG. 7. However, since gains 1 and 2 operate independently, the total gain may be varied by a minimum unit of a gain variable width. This embodiment takes a measure against such variation.

Figure 10:
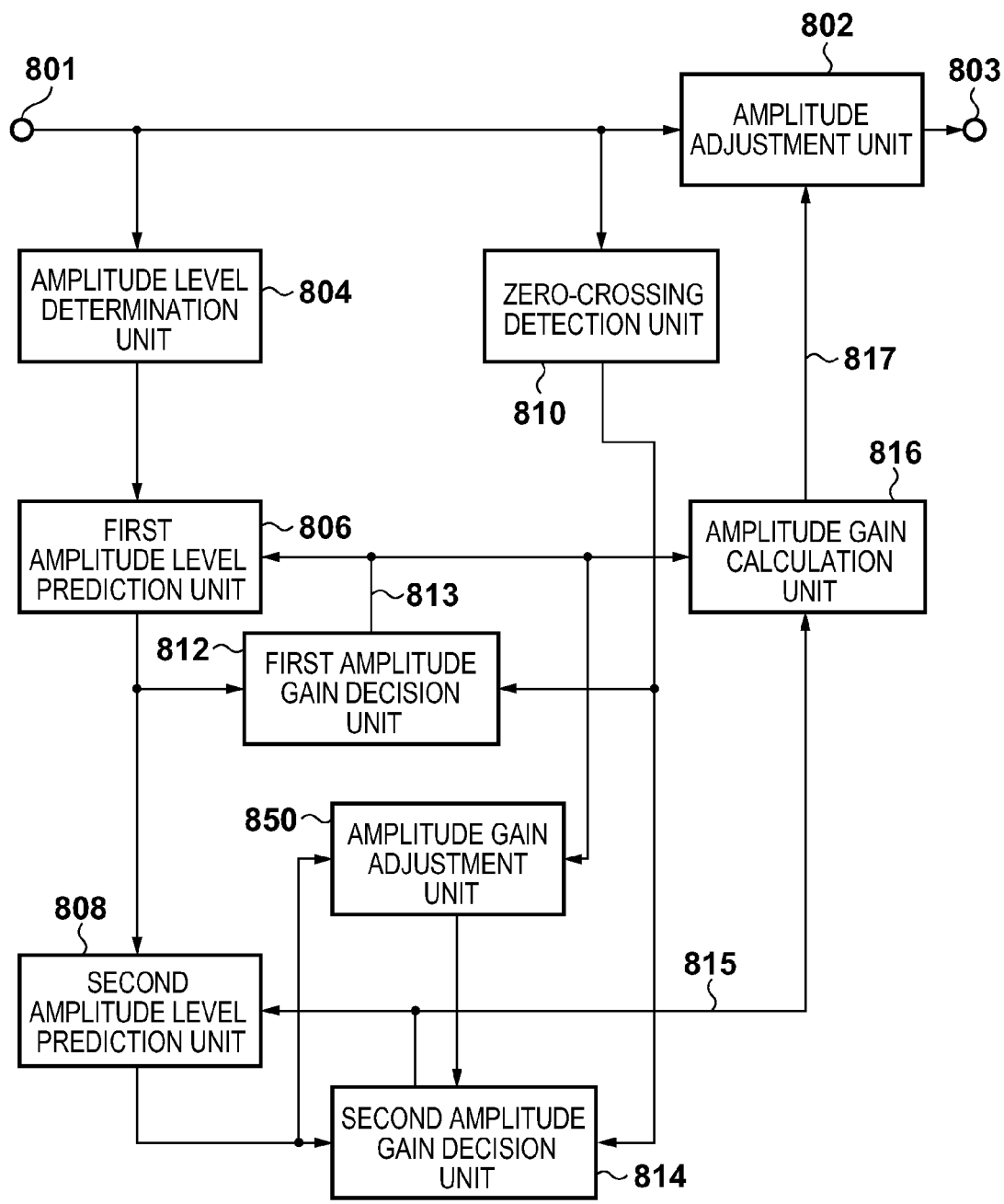
FIG. 10 is a block diagram showing the arrangement of an ALC unit of an audio processing apparatus according to the third embodiment.

FIG. 10 is a block diagram showing the arrangement of an ALC unit of an audio processing apparatus according to the third embodiment. In the arrangement shown in FIG. 10, an amplitude gain adjustment unit 850 which adjusts a gain decided by a first amplitude gain decision unit 812 is added to the arrangement shown in FIG. 8. The same reference numerals denote the same components as those in FIG. 8, and a description thereof will not be repeated. Note that a second amplitude gain decision unit 814 is configured to decide a gain based on the gain adjusted by the amplitude gain adjustment unit 850.

Figure 11:
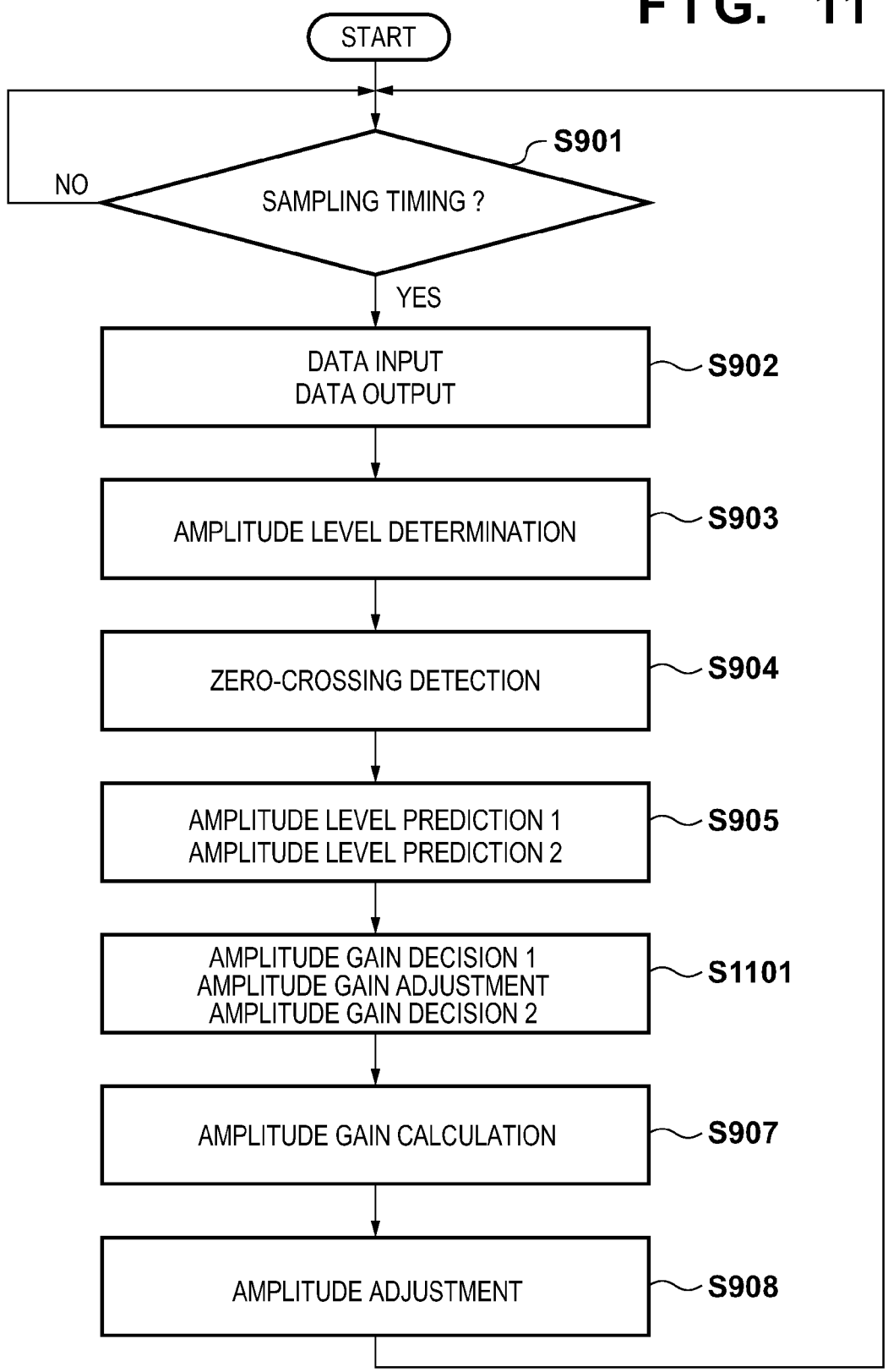
FIG. 11 is a flowchart showing the operation of the ALC unit according to the third embodiment.

FIG. 11 is a flowchart showing the operation of the ALC unit shown in FIG. 10. The same step numbers denote the same steps as those in the flowchart shown in FIG. 9, and a description thereof will not be repeated. In FIG. 11, a difference from FIG. 10 is that step S1101 is executed in place of step S906. In step S1101, the first amplitude gain decision unit 812 decides an amplitude gain. Next, the amplitude gain adjustment unit 850 adjusts that decided amplitude gain by an operation according to the sequence shown in FIG. 12 (to be described later). After that, the second amplitude gain decision unit 814 decides an amplitude gain using the adjustment result.

Figure 12:
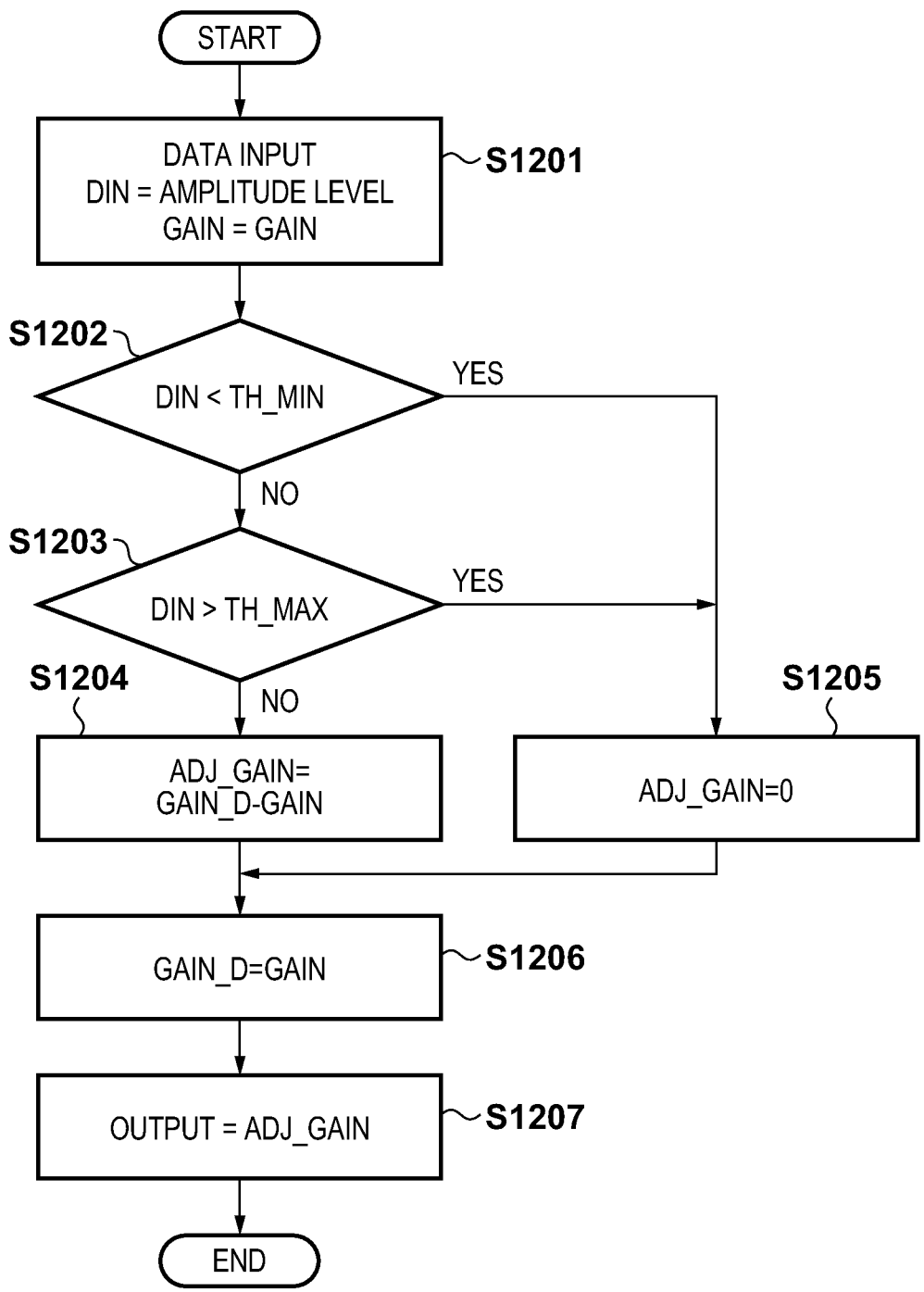
FIG. 12 is a flowchart showing the operation of an amplitude gain adjustment unit according to the third embodiment.

FIG. 12 is a flowchart showing the operation of the amplitude gain adjustment unit 850. Initially, an amplitude level predicted by a first amplitude level prediction unit 806 is input to a variable DIN, and a gain 813 decided by the first amplitude gain decision unit 812 is input to a variable GAIN (step S1201). If a value of DIN falls within a range between TH_MIN and TH_MAX (for TH_MIN<TH_MAX) (NO in both steps S1202 and S1203), GAIN_D-GAIN is substituted in a variable ADJ_GAIN (step S1204). Otherwise, "0" is substituted in the variable ADJ_GAIN (step S1205). GAIN_D is the gain 813 input at a previous sampling timing. GAIN is substituted in GAIN_D for the next sampling timing processing (step S1206). Then, ADJ_GAIN is output to the second amplitude gain decision unit 814 (step S1207).

Figure 13:
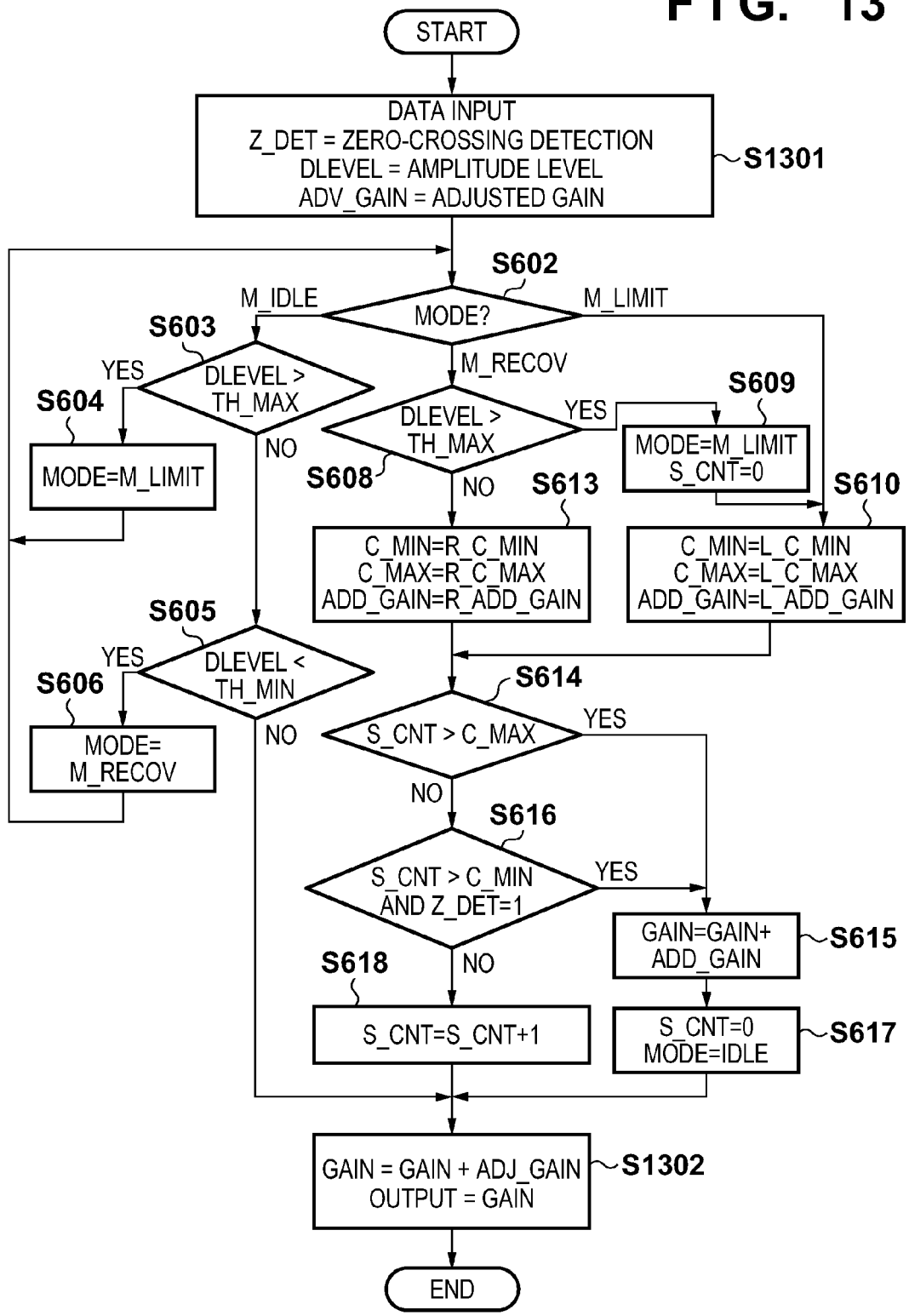
FIG. 13 is a flowchart showing the operation of a second amplitude gain decision unit according to the third embodiment.

FIG. 13 is a flowchart showing the operation of the second amplitude gain decision unit 814. The same step numbers denote the same steps as those in the flowchart shown in FIG. 6, and a description thereof will not be repeated. In FIG. 13, differences from FIG. 6 are that step S1301 is executed in place of step S601, and step S1302 is executed in place of step S607. In step S1301, a zero-crossing detection result of a zero-crossing detection unit 810 is input to a variable Z_DET, and an amplitude level determined by an amplitude level determination unit 804 is input to a variable DLEVEL. Furthermore, an amplitude gain (adjusted gain) adjusted by the amplitude gain adjustment unit 850 is input to a variable ADV_GAIN. On the other hand, in step S1302, a value obtained by adding ADJ_GAIN to current GAIN is updated as new GAIN, and updated GAIN is output.

According to the third embodiment, when an amplitude level predicted by the second amplitude level prediction unit 808 falls within the range between TH_MIN and TH_MAX, if the gain decided by the first amplitude gain decision unit 812 changes, that change amount is adjusted by the amplitude gain adjustment unit 850. With this adjustment, gain 1+gain 2 remain unchanged. Thus, a variation in a minimum unit of a gain variable width can be suppressed during periods 1 to 4 of FIG. 7.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-286160, filed Dec. 27, 2012, which is hereby incorporated by reference herein in its entirety.

What is claimed is:

1. An audio processing apparatus comprising:
an obtaining unit configured to obtain an audio signal;
a first audio level controller configured to give a first gain to the audio signal obtained by the obtaining unit; and
a second audio level controller configured to give a second gain to the audio signal output from the first audio level controller;
a first level detection unit configured to detect a level of the audio signal which is output from the first audio level controller and is input to the second audio level controller,
wherein the first audio level controller decides the first gain in accordance with a detection result from the first level detection unit;
a second level detection unit configured to detect a level of the audio signal which is output from the second audio level controller,
wherein the second audio level controller decides the second gain in accordance with a detection result from the second level detection unit,
wherein a time constant in processing for increasing the first gain of the first audio level controller is larger than a time constant in processing for increasing the second gain of the second audio level controller.

2. The audio processing apparatus according to claim 1, wherein the first audio level controller decreases the first gain in response to that a level detected by the first level detection unit exceeds a predetermined upper limit level, and
the first audio level controller increases the first gain in response to that a level detected by the first level detection unit falls below a predetermined lower limit level.

3. The audio processing apparatus according to claim 1, wherein the second audio level controller decreases the second gain in response to that a level detected by the second level detection unit exceeds a predetermined upper limit level, and
the second audio level controller increases the second gain in response to that a level detected by the second level detection unit falls below a predetermined lower limit level.

4. An audio processing apparatus comprising:
an obtaining unit configured to obtain an audio signal;
a first audio level controller configured to give a first gain to the audio signal obtained by the obtaining unit; and
a second audio level controller configured to give a second gain to the audio signal output from the first audio level controller,
wherein a time constant in processing for increasing the first gain of the first audio level controller is larger than a time constant in processing for increasing the second gain of the second audio level controller;
a detection unit configured to detect if a level of the audio signal obtained by the obtaining unit reaches a zero level,
wherein the first audio level controller changes the first gain at a detection timing of the zero level by the detection unit.

5. The audio processing apparatus according to claim 1, further comprising:
a zero level detection unit configured to detect if a level of the audio signal output from the first audio level controller reaches a zero level,
wherein the second audio level controller changes the second gain at a detection timing of the zero level by the zero level detection unit.

6. An audio processing apparatus comprising:
an obtaining unit configured to obtain an audio signal;
an audio level controller configured to give a predetermined gain to the audio signal obtained by the obtaining unit;
a first prediction unit configured to decide a first predicted gain required to decide the predetermined gain based on a level of the audio signal obtained by the obtaining unit, and to generate an audio signal by giving the decided first predicted gain to the audio signal obtained by the obtaining unit; and a second prediction unit configured to decide a second predicted gain required to decide the predetermined gain, wherein the second prediction unit decides the second predicted gain in accordance with a level of the audio signal which is output from the first prediction unit and is input to the second prediction unit, wherein the audio level controller decides the predetermined gain based on the first predicted gain and the second predicted gain, and a time constant in processing for increasing the first predicted gain of the first prediction unit is larger than a time constant in processing for increasing the second predicted gain of the second prediction unit.

7. The audio processing apparatus according to claim 6, wherein the first prediction unit decreases the first predicted gain in response to that a level of the audio signal obtained by the obtaining unit exceeds a predetermined upper limit level, and the first prediction unit increases the first predicted gain in response to that a level of the audio signal obtained by the obtaining unit falls below a predetermined lower limit level.

8. The audio processing apparatus according to claim 6, wherein the second prediction unit decreases the second predicted gain in response to that a level of the audio signal which is output from the first prediction unit and is input to the second prediction unit exceeds a predetermined upper limit level, and the second prediction unit increases the second predicted gain in response to that a level of the audio signal generated by the first prediction unit falls below a predetermined lower limit level.

9. An audio processing apparatus comprising:
an obtaining unit configured to obtain an audio signal;
an audio level controller configured to give a predetermined gain to the audio signal obtained by the obtaining unit;
a first prediction unit configured to decide a first predicted gain required to decide the predetermined gain based on a level of the audio signal obtained by the obtaining unit, and to generate an audio signal by giving the decided first predicted gain to the audio signal obtained by the obtaining unit; and
a second prediction unit configured to decide a second predicted gain required to decide the predetermined gain based on a level of the audio signal generated by the first prediction unit, wherein the predetermined gain is decided based on the first predicted gain and the second predicted gain;
wherein a time constant in processing for increasing the first predicted gain of the first prediction unit is larger than a time constant in processing for increasing the second predicted gain of the second prediction unit;
a detection unit configured to detect if a level of the audio signal obtained by the obtaining unit reaches a zero level,
wherein the first prediction unit changes the first predicted gain at a detection timing of the zero level by the detection unit.

10. The audio processing apparatus according to claim 6, further comprising:
a detection unit configured to detect if a level of the audio signal generated by the first prediction unit reaches a zero level,
wherein the second prediction unit changes the second predicted gain at a detection timing of the zero level by the detection unit.

11. An audio processing method comprising:
obtaining an audio signal;
giving a first gain to the obtained audio signal; and
giving a second gain to the audio signal given with the first gain,
first level detecting a level of the audio signal which is output from the step of giving a first gain and is input to the step of giving a second gain,
wherein the step of giving a first gain decides the first gain in accordance with a detection result from the step of first level detecting;
second level detecting a level of the audio signal which is output from the step of giving a second gain,
wherein the step of giving a second gain decides the second gain in accordance with a detection result from the step of second level detecting,
wherein a time constant in processing for increasing the first gain is larger than a time constant in processing for increasing the second gain.

12. The audio processing method according to claim 11, further comprising:
decreasing the first gain in response to that a level detected in the step of first level detecting exceeds a predetermined upper limit level, and increasing the first gain in response to that a level detected in the step of first level detecting falls below a predetermined lower limit level.

13. The audio processing method according to claim 11, further comprising:
decreasing the second gain in response to that a level detected in the step of second level detecting exceeds a predetermined upper limit level, and increasing the second gain in response to that a level detected in the step of second level detecting falls below a predetermined lower limit level.

14. The audio processing method according to claim 11, further comprising:
detecting if a level of the obtained audio signal reaches a zero level; and
changing the first gain in response to detection of the zero level.

15. The audio processing method according to claim 11, further comprising:
detecting if a level of the obtained audio signal reaches a zero level; and
changing the second gain in response to detection of the zero level.

16. An audio processing method comprising:
obtaining an audio signal;
giving a predetermined gain to the obtained audio signal;
deciding a first predicted gain required to decide the predetermined gain based on a level of the obtained audio signal, and generating an audio signal by giving the decided first predicted gain to the obtained audio signal; and
deciding a second predicted gain required to decide the predetermined gain,
wherein the step of deciding the second predicted gain, a level of the audio signal which is output in the step of deciding the first predicted gain,
wherein, the step of giving a predetermined gain decides the predetermined gain based on the first predicted gain and the second predicted gain, and a time constant in processing for increasing the first predicted gain is larger than a time constant in processing for increasing the second predicted gain.

17. The audio processing method according to claim 16, further comprising:

decreasing the first predicted gain in response to that a level of the obtained audio signal exceeds a predetermined upper limit level, and increasing the first predicted gain in response to that a level of the obtained audio signal falls below a predetermined lower limit level.

18. The audio processing method according to claim 16, further comprising:

decreasing the second predicted gain in response to that a level of the audio signal given the first predicted gain exceeds a predetermined upper limit level, and increasing the second predicted gain in response to that a level of the audio signal given the first predicted gain falls below a predetermined lower limit level.

19. The audio processing method according to claim 16, further comprising:

detecting if a level of the obtained audio signal reaches a zero level; and changing the first predicted gain in response to detection of the zero level.

20. The audio processing method according to claim 16, further comprising:

detecting if a level of the audio signal given the first predicted gain reaches a zero level; and changing the second predicted gain in response to detection of the zero level.

* * * * *